(12) United States Patent
de Lind van Wijngaarden et al.

(10) Patent No.: US 6,241,778 B1
(45) Date of Patent: Jun. 5, 2001

(54) METHODS AND APPARATUS FOR IMPLEMENTING RUN-LENGTH LIMITED AND MAXIMUM TRANSITION RUN CODES

(75) Inventors: Adriaan J. de Lind van Wijngaarden, Basking Ridge; Emina Soljanin, Chatham, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/335,816

(22) Filed: Jun. 18, 1999

(51) Int. Cl.[7] .............................. H03M 5/00; H03M 5/06
(52) U.S. Cl. .............................. 341/58; 341/58; 341/59; 341/68; 341/69; 341/106
(58) Field of Search ................................ 341/58, 59, 68, 341/69, 106

(56) References Cited

U.S. PATENT DOCUMENTS

| | | | |
|---|---|---|---|
| 5,757,294 | * 5/1998 | Fisher et al. | 341/57 |
| 5,812,073 | * 9/1998 | Lee et al. | 341/59 |
| 5,859,601 | * 1/1999 | Moon et al. | 341/59 |
| 5,933,103 | * 8/1999 | Kim | 341/59 |
| 6,046,691 | * 4/2000 | Aziz et al. | 341/58 |
| 6,052,072 | * 4/2000 | Tsang et al. | 341/59 |
| 6,081,210 | * 6/2000 | Nikolic et al. | 341/59 |

OTHER PUBLICATIONS

E. Soljanin and A.J. van Wijngaarden, "On the Capacity of Distance Enhancing Constraints for High Density Magnetic Recording Channels," Proc. Workshop on Coding and Cryptography WCC'99, pp. 203–212, Paris, France, Jan. 1999.

A.J. van Wijngaarden and K.A.S. Immink, "Combinatorial Construction of High Rate Runlength–limited Codes," IEEE Global Telecommun. Conf. Globecom '96, pp. 343–347, 1996.

K.A. Schouhamer–Immink and A. Wijngaarden, "Simple high–rate constrained codes," Electronics Letters, vol. 32, No. 20, p. 1877, 1996.

* cited by examiner

Primary Examiner—Michael Tokar
Assistant Examiner—Vibol Tan
(74) Attorney, Agent, or Firm—Ryan, Mason & Lewis, LLP

(57) ABSTRACT

Data words are converted to codewords in accordance with a run-length limited (RLL) or maximum transition run (MTR) code in which the codewords are subject to one or more constraints on the number of consecutive like symbols. The data words and codewords are each partitioned into a number of disjoint subsets. Associated with each of the disjoint subsets of data words is a distinct mapping. A given data word is converted to a codeword by applying to the given data word the mapping associated with the subset containing that data word. The mappings are configured to utilize symmetry whenever possible. For example, if $Y=\psi(X)$ represents the mapping of a given data word X onto a corresponding codeword Y, then it is preferred that X' and Y' representing the words X and Y in reversed order, satisfy the relation $Y'=\psi(X')$. An example of an efficient high-rate, multi-purpose code in accordance with the invention is a rate 16/17 code satisfying (0,15,9,9) RLL and (0,3,2,2) MTR constraints. This exemplary code can be further processed using interleaving techniques to generate other higher rate codes.

24 Claims, 23 Drawing Sheets

FIG. 1
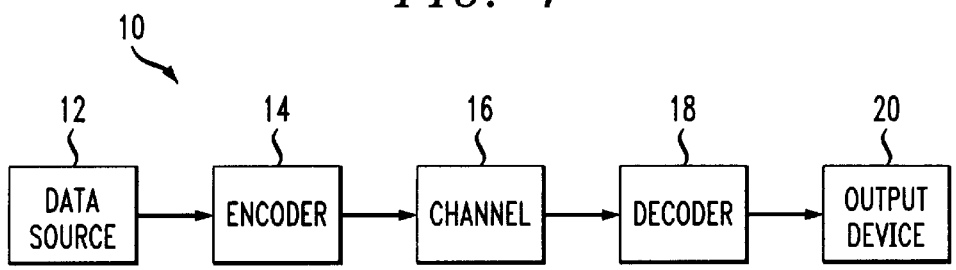
FIG. 2A
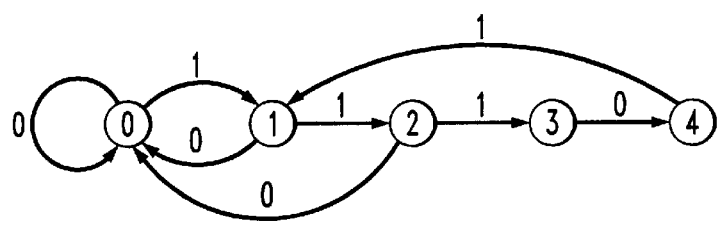
FIG. 2B
FIG. 2C
$$A = \begin{bmatrix} 1 & 1 & 0 & 0 & 0 \\ 1 & 0 & 1 & 0 & 0 \\ 1 & 0 & 0 & 1 & 0 \\ 0 & 0 & 0 & 0 & 1 \\ 0 & 1 & 0 & 0 & 0 \end{bmatrix} \quad C = .913$$

a: 0 0 |1 0 1| 0     0 1 |1 0 1| 0     1 0 |1 0 1| 0     1 1 |1 0 1| 0
b: 0 0 |0 1 0| 0     0 1 |0 1 0| 0     1 0 |0 1 0| 0     1 1 |0 1 0| 0 a: 0 0 |1 0 1| 1     0 1 |1 0 1| 1     1 0 |1 0 1| 1     1 1 |1 0 1| 1
b: 0 0 |0 1 0| 1     0 1 |0 1 0| 1     1 0 |0 1 0| 1     1 1 |0 1 0| 1

$$A = \begin{bmatrix} 1 & 0 & 0 & 1 & 0 \\ 1 & 0 & 1 & 0 & 0 \\ 0 & 1 & 0 & 1 & 0 \\ 0 & 1 & 0 & 0 & 1 \\ 0 & 1 & 0 & 0 & 0 \end{bmatrix} \quad C = .913...$$

| | | | | | | | | | | | | | | | | | | | | | | | | | | | | |
|---|---|---|---|---|---|---|---|---|---|---|---|---|---|---|---|---|---|---|---|---|---|---|---|---|---|---|---|---|
| a: | 0 0 | 1 0 1 | 0 0 | | 0 1 | 1 0 1 | 0 0 | | 1 0 | 1 0 1 | 0 0 | | 1 1 | 1 0 1 | 0 0 |
| b: | 0 0 | 0 1 0 | 0 0 | | 0 1 | 0 1 0 | 0 0 | | 1 0 | 0 1 0 | 0 0 | | 1 1 | 0 1 0 | 0 0 |

| a: | 0 0 | 1 0 1 | 0 1 | | 0 1 | 1 0 1 | 0 1 | | 1 0 | 1 0 1 | 0 1 | | 1 1 | 1 0 1 | 0 1 |
|---|---|---|---|---|---|---|---|---|---|---|---|---|---|---|---|
| b: | 0 0 | 0 1 0 | 0 1 | | 0 1 | 0 1 1 | 0 1 | | 1 0 | 0 1 0 | 0 1 | | 1 1 | 0 1 0 | 0 1 |

| a: | 0 0 | 1 0 1 | 1 0 | | 0 1 | 1 0 1 | 1 0 | | 1 0 | 1 0 1 | 1 0 | | 1 1 | 1 0 1 | 1 0 |
|---|---|---|---|---|---|---|---|---|---|---|---|---|---|---|---|
| b: | 0 0 | 0 1 0 | 1 0 | | 0 1 | 0 1 0 | 1 0 | | 1 0 | 0 1 0 | 1 0 | | 1 1 | 0 1 0 | 1 0 |

| a: | 0 0 | 1 0 1 | 1 1 | | 0 1 | 1 0 1 | 1 1 | | 1 0 | 1 0 1 | 1 1 | | 1 1 | 1 0 1 | 1 1 |
|---|---|---|---|---|---|---|---|---|---|---|---|---|---|---|---|
| b: | 0 0 | 0 1 0 | 1 1 | | 0 1 | 0 1 0 | 1 1 | | 1 0 | 0 1 0 | 1 1 | | 1 1 | 0 1 0 | 1 1 |

$$A = \begin{bmatrix} 0 & 2 & 0 & 0 & 0 & 0 & 0 & 0 & 0 \\ 1 & 0 & 1 & 0 & 0 & 0 & 0 & 0 & 0 \\ 0 & 0 & 0 & 1 & 1 & 0 & 0 & 0 & 0 \\ 1 & 0 & 0 & 0 & 0 & 0 & 0 & 0 & 0 \\ 1 & 0 & 0 & 0 & 0 & 1 & 0 & 0 & 0 \\ 0 & 0 & 0 & 0 & 1 & 0 & 1 & 0 & 0 \\ 1 & 0 & 0 & 0 & 0 & 0 & 0 & 1 & 0 \\ 0 & 0 & 0 & 0 & 0 & 0 & 0 & 0 & 1 \\ 0 & 0 & 0 & 0 & 0 & 1 & 0 & 0 & 0 \end{bmatrix} \quad C = .9227...$$

a:  0 |1 0 1| 0 0    1 |1 0 1| 0 0    0 |1 0 1| 0 1    1 |1 0 1| 0 1
b:  0 |0 1 0| 0 0    1 |0 1 0| 0 0    0 |0 1 0| 0 1    1 |0 1 0| 0 1 a:  0 |1 0 1| 1 0    1 |1 0 1| 1 0    0 |1 0 1| 1 1    1 |1 0 1| 1 1
b:  0 |0 1 0| 1 0    1 |0 1 0| 1 0    0 |0 1 0| 1 1    1 |0 1 0| 1 1

$$A = \begin{bmatrix} 1 & 1 & 0 & 0 \\ 1 & 0 & 1 & 0 \\ 1 & 0 & 0 & 1 \\ 1 & 0 & 0 & 0 \end{bmatrix} \quad C = .946...$$

a: 0 |1 0 1| 0 0    1 |1 0 1| 0 0    0 |1 0 1| 0 1    1 |1 0 1| 0 1 b: 0 |0 1 0| 0 0    1 |0 1 0| 0 0    0 |0 1 0| 0 1    1 |0 1 0| 0 1 a: 0 |1 0 1| 1 0    1 |1 0 1| 1 0    0 |1 0 1| 1 1    1 |1 0 1| 1 1 b: 0 |0 1 0| 1 0    1 |0 1 0| 1 0    0 |0 1 0| 1 1    1 |0 1 0| 1 1

$$A = \begin{bmatrix} 1 & 1 & 0 & 0 & 0 \\ 1 & 0 & 1 & 0 & 0 \\ 1 & 0 & 0 & 1 & 0 \\ 1 & 0 & 0 & 0 & 1 \\ 1 & 0 & 0 & 0 & 0 \end{bmatrix} \quad C = .975$$

a: 0 |1 0 1| 0 0    1 |1 0 1| 0 0    0 |1 0 1| 0 1    1 |1 0 1| 0 1
b: 0 |0 1 0| 0 0    1 |0 1 0| 0 0    0 |0 1 0| 0 1    1 |0 1 0| 0 1 a: 0 |1 0 1| 1 0    1 |1 0 1| 1 0    0 |1 0 1| 1 1    1 |1 0 1| 1 1
b: 0 |0 1 0| 1 0    1 |0 1 0| 1 0    0 |0 1 0| 1 1    1 |0 1 0| 1 1

$$A = \begin{bmatrix} 1 & 1 & 1 & 1 \\ 1 & 1 & 1 & 1 \\ 1 & 1 & 0 & 1 \\ 1 & 1 & 1 & 1 \end{bmatrix} \quad C = .961...$$

FIG. 8

| | STRING REPRESENTATION | | | | | | | | CHARACTERIZATION | SIZE |
|---|---|---|---|---|---|---|---|---|---|---|
| $v_1$ | 1 | 1 | 1 | $x_4$ | $x_5$ | $x_6$ | $x_7$ | $x_8$ | $x_4 x_5 x_6 x_7 x_8 \in A^5$ | 32 |
| $v_2$ | 0 | 1 | 1 | 1 | 1 | $x_6$ | $x_7$ | $x_8$ | $x_6 x_7 x_8 \in A^3$ | 8 |
| $v_3$ | $x_1$ | 0 | 1 | 1 | 1 | 1 | $x_7$ | $x_8$ | $x_1 x_7 x_8 \in A^3$ | 8 |
| $v_4$ | $x_1$ | $x_2$ | 0 | 1 | 1 | 1 | 1 | $x_8$ | $x_1 x_2 x_8 \in A^3$ | 8 |
| $v_5$ | $x_1$ | $x_2$ | $x_3$ | 0 | 1 | 1 | 1 | 1 | $x_1 x_2 x_3 \in A^3 \setminus \{111\}$ | 7 |

FIG. 9

| $W_{i,j}$ | j=0 | j=1 | j=2 | j=3 | j=4 | j=5 |
|---|---|---|---|---|---|---|
| i=0 | 37249 | 6176 | 1544 | 1544 | 1544 | 1351 |
| i=1 | 6176 | 1024 | 256 | 256 | 256 | 224 |
| i=2 | 1544 | 256 | 64 | 64 | 64 | 56 |
| i=3 | 1544 | 256 | 64 | 64 | 64 | 56 |
| i=4 | 1544 | 256 | 64 | 64 | 64 | 56 |
| i=5 | 1351 | 224 | 56 | 56 | 56 | 49 |

FIG. 10

| | FORMAT | SET | SIZE |
|---|---|---|---|
| $\mathcal{M}_0$ | ········ 0 ········ | $\mathcal{G}_{3,2,3}^{(8)} \times \mathcal{G}_{3,3,2}^{(8)}$ | 193 x 193 = 37249 |
| $\mathcal{M}_1$ | ······· 110 ······· | $\mathcal{G}_{3,2,1}^{(7)} \times \mathcal{G}_{3,3,2}^{(7)}$ | 79 x 100 = 7900 |
| $\mathcal{M}_2$ | ······· 011 ······· | $\mathcal{G}_{3,2,3}^{(7)} \times \mathcal{G}_{3,1,2}^{(7)}$ | 100 x 79 = 7900 |
| $\mathcal{M}_3$ | ······ 10100 ······ | $\mathcal{G}_{3,2,2}^{(6)} \times \mathcal{G}_{3,3,2}^{(6)}$ | 48 x 52 = 2496 |
| $\mathcal{M}_4$ | ······ 00101 ······ | $\mathcal{G}_{3,2,3}^{(6)} \times \mathcal{G}_{3,2,2}^{(6)}$ | 52 x 48 = 2496 |
| $\mathcal{M}_5$ | ······ 00100 ······ | $\mathcal{G}_{3,2,3}^{(6)} \times \mathcal{G}_{3,3,2}^{(6)}$ | 52 x 52 = 2704 |
| $\mathcal{M}_6$ | ······ 01110 ······ | $\mathcal{G}_{3,2,3}^{(6)} \times \mathcal{G}_{3,3,2}^{(6)}$ | 52 x 52 = 2704 |
| $\mathcal{M}_7$ | ······ 10101 ······ | $\mathcal{G}_{3,2,2}^{(6)} \times \mathcal{G}_{3,2,2}^{(6)}$ | 48 x 48 = 2304 |

FIG. 11

| | $y_1^l$ | $y_2^l$ | $y_3^l$ | $y_4^l$ | $y_5^l$ | $y_6^l$ | $y_7^l$ | $y_8^l$ | $y_c$ | $y_8^r$ | $y_7^r$ | $y_6^r$ | $y_5^r$ | $y_4^r$ | $y_3^r$ | $y_2^r$ | $y_1^r$ |
|---|---|---|---|---|---|---|---|---|---|---|---|---|---|---|---|---|---|
| $W_{0,0}^{[1]}$ X | $x_1^l$ | $x_2^l$ | $x_3^l$ | $x_4^l$ | $x_5^l$ | $x_6^l$ | 1 | 0 | $\underline{1}$ | 0 | 0 | 0 | 0 | 0 | 0 | 0 | 0 |
| $W_{0,0}^{[1]}$ Y | $x_1^l$ | $x_2^l$ | $x_3^l$ | $\underline{0}$ | $\underline{1}$ | $\underline{1}$ | $\underline{0}$ | $\underline{0}$ | $\underline{1}$ | $\underline{0}$ | $\underline{0}$ | $x_4^l$ | $x_5^l$ | $x_6^l$ | $\underline{1}$ | $\underline{0}$ | 1 |
| $W_{0,0}^{[2]}$ X | $x_1^l$ | $x_2^l$ | $x_3^l$ | $x_4^l$ | $x_5^l$ | $x_6^l$ | 0 | 0 | 1 | 0 | 0 | 0 | 0 | 0 | 0 | 0 | 0 |
| $W_{0,0}^{[2]}$ Y | $x_4^l$ | $\underline{0}$ | 1 | $x_1^l$ | $x_2^l$ | $x_3^l$ | 1 | $\underline{0}$ | $\underline{1}$ | $\underline{0}$ | $\underline{0}$ | 1 | 1 | 1 | 0 | 0 | 0 |
| $W_{0,0}^{[3]}$ X | 0 | 0 | 0 | 0 | 0 | 0 | 0 | 0 | 1 | 0 | 1 | 0 | 0 | 0 | 0 | 0 | 0 |
| $W_{0,0}^{[3]}$ Y | 1 | $\underline{0}$ | 1 | $x_6^r$ | $x_5^r$ | $x_4^r$ | $\underline{0}$ | $\underline{0}$ | $\underline{1}$ | $\underline{0}$ | 1 | 1 | 1 | 1 | 0 | 0 | 0 |
| $W_{0,0}^{[4]}$ X | 0 | 0 | 0 | 0 | 0 | 0 | 0 | 0 | 1 | 0 | $\underline{0}$ | $x_6^r$ | $x_5^r$ | $x_4^r$ | $x_3^r$ | $x_2^r$ | $x_1^r$ |
| $W_{0,0}^{[4]}$ Y | 1 | $\underline{0}$ | 1 | 1 | 1 | 1 | 1 | $\underline{0}$ | $\underline{1}$ | $\underline{0}$ | $\underline{0}$ | 1 | $x_2^r$ | $x_1^r$ | $x_3^r$ | $x_2^r$ | $x_1^r$ |
| $W_{0,0}^{[5]}$ X | $x_1^l$ | $x_2^l$ | $x_3^l$ | $x_4^l$ | $x_5^l$ | $x_6^l$ | $x_7^l$ | $x_8^l$ | $\underline{0}$ | $x_8^r$ | $x_7^r$ | $x_6^r$ | $x_5^r$ | $x_4^r$ | $x_3^r$ | $x_2^r$ | $x_1^r$ |
| $W_{0,0}^{[5]}$ Y | $x_1^l$ | $x_2^l$ | $x_3^l$ | $x_4^l$ | $x_5^l$ | $x_6^l$ | $x_7^l$ | $x_8^l$ | $\underline{0}$ | $x_8^r$ | 1 | $x_6^r$ | $x_5^r$ | $x_4^r$ | $x_3^r$ | $x_2^r$ | $x_1^r$ |

| | $y_1^l$ $x_1^l$ | $y_2^l$ | $y_3^l$ | $y_4^l$ | $y_5^l$ | $y_6^l$ | $y_7^l$ | $y_8^l$ | $y_c$ | $y_8^r$ | $y_7^r$ | $y_6^r$ | $y_5^r$ | $y_4^r$ | $y_3^r$ | $y_2^r$ | $y_1^r$ | |
|---|---|---|---|---|---|---|---|---|---|---|---|---|---|---|---|---|---|---|
| $W_{4,\{0,5\}}^{[1]}$ X | $x_1^l$ | 1 | 0 | 1 | 1 | 1 | 1 | 1 | $x_8^r$ | 1 | $x_7^r$ | $x_6^r$ | $x_5^r$ | $x_4^r$ | $x_3^r$ | $x_2^r$ | $x_1^r$ | $S$ |
| Y | $x_1^r$ | $\underline{0}$ | 1 | $\underline{0}$ | 1 | 1 | $\underline{0}$ | 1 | $\underline{1}$ | $\underline{0}$ | $x_7^r$ | $x_6^r$ | $x_5^r$ | $x_4^r$ | $x_3^r$ | $x_2^r$ | $x_1^r$ | |
| $W_{4,\{0,5\}}^{[2]}$ X | 1 | 1 | 0 | 1 | $x_8^r$ | 1 | 1 | 0 | $\underline{1}$ | 1 | $x_7^r$ | $x_6^r$ | $x_5^r$ | $x_4^r$ | $x_3^r$ | $x_2^r$ | $x_1^r$ | $S$ |
| Y | 0 | $\underline{1}$ | $\underline{1}$ | $\underline{1}$ | 0 | $x_7^r$ | $\underline{0}$ | $\underline{0}$ | $\underline{1}$ | $\underline{0}$ | $x_7^r$ | $x_6^r$ | $x_5^r$ | $x_4^r$ | $x_3^r$ | $x_2^r$ | $x_1^r$ | |
| $W_{4,\{0,5\}}^{[3]}$ X | 1 | 0 | 1 | 1 | 1 | 1 | 1 | $x_8^l$ | $\underline{1}$ | $x_8^r$ | $x_7^r$ | $x_6^r$ | $x_5^r$ | $x_4^r$ | $x_3^r$ | $x_2^r$ | $x_1^r$ | $S$ |
| Y | $x_8^l$ | $\underline{0}$ | $\underline{1}$ | $\underline{1}$ | $\underline{0}$ | 1 | $\underline{0}$ | $\underline{1}$ | $\underline{1}$ | $\underline{0}$ | $x_7^r$ | $x_6^r$ | $x_5^r$ | $x_4^r$ | $x_3^r$ | $x_2^r$ | $x_1^r$ | |
| $W_{4,\{0,5\}}^{[4]}$ X | $x_1^l$ | $x_2^l$ | $\underline{1}$ | $x_1^l$ | $x_8^r$ | $x_8^l$ | 1 | $x_8^l$ | $\underline{1}$ | $\underline{0}$ | $x_7^r$ | $x_6^r$ | $x_5^r$ | $x_4^r$ | $x_3^r$ | $x_2^r$ | $x_1^r$ | $S$ |
| Y | 0 | $\underline{1}$ | $\underline{1}$ | $x_1^l$ | $x_8^r$ | $x_8^l$ | $\underline{1}$ | $\underline{1}$ | $\underline{1}$ | $\underline{0}$ | $x_7^r$ | $x_6^r$ | $x_5^r$ | $x_4^r$ | $x_3^r$ | $x_2^r$ | $x_1^r$ | |
| $W_{5,0}^{[1]}$ X | $x_1^l$ | $x_2^l$ | $x_3^l$ | 0 | 1 | 1 | 1 | 1 | $\underline{1}$ | $x_8^r$ | 1 | $x_6^r$ | $x_5^r$ | $x_4^r$ | $x_3^r$ | $x_2^r$ | $x_1^r$ | $S$ |
| Y | $x_8^r$ | $\underline{0}$ | $\underline{1}$ | $x_1^l$ | $x_2^l$ | $x_3^l$ | 1 | $\underline{0}$ | $\underline{1}$ | $\underline{0}$ | $\underline{0}$ | $x_6^r$ | $x_5^r$ | $x_4^r$ | $x_3^r$ | $x_2^r$ | $x_1^r$ | |
| $W_{5,0}^{[2]}$ X | $x_1^l$ | $x_2^l$ | $x_3^l$ | 0 | 1 | 1 | $\underline{0}$ | 1 | $\underline{1}$ | $x_8^r$ | 0 | $x_6^r$ | $x_5^r$ | $x_4^r$ | $x_3^r$ | $x_2^r$ | $x_1^r$ | $S'$ |
| Y | $x_8^r$ | $\underline{0}$ | $\underline{1}$ | $x_1^l$ | $x_2^l$ | $x_3^l$ | $\underline{0}$ | $\underline{0}$ | $\underline{1}$ | $\underline{0}$ | $\underline{0}$ | $x_6^r$ | $x_5^r$ | $x_4^r$ | $x_3^r$ | $x_2^r$ | $x_1^r$ | |

FIG. 13

| | | 1 | 2 | 3 | 4 | 5 | 6 | 7 | 8 |
|---|---|---|---|---|---|---|---|---|---|
| $\nu_1^{[1]}$ | X | 1 | 1 | 1 | 1 | 1 | 1 | $x_7$ | $x_8$ |
| | Y | $x_8$ | $\underline{0}$ | $\underline{1}$ | $\underline{1}$ | $\underline{0}$ | $x_7$ | $\underline{1}$ | $\underline{0}$ |
| $\nu_1^{[2]}$ | X | 1 | 1 | 1 | $x_4$ | $x_5$ | $x_6$ | $x_7$ | $x_8$ |
| | Y | $x_8$ | $x_7$ | $\underline{0}$ | $x_4$ | $x_5$ | $x_6$ | $\underline{1}$ | $\underline{0}$ |
| $\nu_2^{[1]}$ | X | 0 | 1 | 1 | 1 | 1 | 1 | 1 | $x_8$ |
| | Y | $x_8$ | 0 | $\underline{1}$ | $\underline{1}$ | $\underline{1}$ | 0 | $\underline{1}$ | $\underline{0}$ |
| $\nu_2^{[2]}$ | X | 0 | 1 | 1 | 1 | 1 | $x_6$ | $x_7$ | $x_8$ |
| | Y | 0 | $\underline{1}$ | $\underline{1}$ | $x_6$ | $x_7$ | $x_8$ | $\underline{1}$ | $\underline{0}$ |
| $\nu_3$ | X | $x_1$ | 0 | 1 | 1 | 1 | 1 | $x_7$ | $x_8$ |
| | Y | $x_1$ | $\underline{0}$ | $\underline{1}$ | $\underline{0}$ | $x_7$ | $x_8$ | $\underline{1}$ | $\underline{0}$ |

FIG. 14

| | $y_1^l$ | $y_2^l$ | $y_3^l$ | $y_4^l$ | $y_5^l$ | $y_6^l$ | $y_7^l$ | $y_8^l$ | $y_c$ | $y_8^r$ | $y_7^r$ | $y_6^r$ | $y_5^r$ | $y_4^r$ | $y_3^r$ | $y_2^r$ | $y_1^r$ | $S'$ |
|---|---|---|---|---|---|---|---|---|---|---|---|---|---|---|---|---|---|---|
| $W_{4,1}^{[1]}$ | 1 | 1 | 0 | 1 | 1 | 1 | 1 | $x_8^l$ | 1 | $x_8^r$ | $x_7^r$ | 1 | 1 | 1 | 1 | 1 | 1 | $S'$ |
|  | 0 | 1 | 1 | 0 | $x_8^r$ | 1 | 0 | 0 | 1 | 0 | 0 | 1 | 0 | 1 | 1 | 1 | 0 | |
| $W_{4,1}^{[2]}$ | 1 | 1 | 0 | 1 | 1 | 1 | 1 | $x_8^l$ | 1 | $x_8^r$ | $x_7^r$ | $x_6^r$ | $x_5^r$ | $x_4^r$ | 1 | 1 | 1 | $S'$ |
|  | 0 | 1 | 1 | 0 | $x_8^r$ | $x_8^l$ | 0 | 0 | 1 | 0 | 0 | 0 | 0 | 0 | 1 | 0 | $x_7^r$ | |
| $W_{4,1}^{[3]}$ | $x_1^l$ | $x_2^l$ | 0 | 1 | 1 | 1 | 1 | $x_8^l$ | 1 | $x_8^r$ | $x_7^r$ | $x_6^r$ | $x_5^r$ | $x_4^r$ | 1 | 1 | 1 | $S'$ |
|  | 0 | 1 | 1 | $x_1^l$ | $x_2^l$ | $x_8^l$ | 0 | 0 | 1 | 0 | 0 | 0 | 0 | 0 | 0 | $x_8^r$ | $x_7^r$ | |

FIG. 15A

| | $y_1^l$ | $y_2^l$ | $y_3^l$ | $y_4^l$ | $y_5^l$ | $y_6^l$ | $y_7^l$ | $y_8^l$ | $y_c$ | $y_8^r$ | $y_7^r$ | $y_6^r$ | $y_5^r$ | $y_4^r$ | $y_3^r$ | $y_2^r$ | $y_1^r$ |
|---|---|---|---|---|---|---|---|---|---|---|---|---|---|---|---|---|---|
| $W_{4,4}^{[1]}$ | $x_1^l$ | 1 | 0 | 1 | 1 | 1 | 1 | 1 | 1 | 0 | 1 | 1 | 1 | 1 | 0 | 1 | $x_1^r$ |
| | 0 | $\underline{1}$ | $\underline{1}$ | $\underline{1}$ | 0 | $x_1^r$ | $\underline{0}$ | $\underline{0}$ | 1 | $\underline{0}$ | $\underline{0}$ | $x_1^r$ | 0 | $\underline{1}$ | $\underline{1}$ | $\underline{1}$ | 0 |
| $W_{4,4}^{[2]}$ | $x_1^l$ | 1 | 0 | 1 | 1 | $x_1^r$ | 1 | 1 | 1 | 1 | 1 | $x_1^r$ | 1 | 1 | 0 | 1 | $x_1^r$ |
| | 0 | $\underline{1}$ | $\underline{1}$ | $\underline{1}$ | 0 | $x_1^r$ | 0 | $\underline{1}$ | $\underline{1}$ | $\underline{1}$ | 0 | $x_1^r$ | 0 | $\underline{1}$ | $\underline{1}$ | $\underline{1}$ | 0 |
| $W_{4,4}^{[3]}$ | $x_1^l$ | $x_2^l$ | 0 | 1 | 1 | 1 | 1 | $x_8^l$ | 1 | 1 | 1 | 1 | 1 | 1 | 0 | $x_2^r$ | $x_1^r$ |
| | $x_1^l$ | $\underline{0}$ | $\underline{1}$ | $x_2^l$ | $x_8^l$ | $x_2^r$ | $\underline{0}$ | $\underline{1}$ | $\underline{1}$ | $\underline{1}$ | $\underline{0}$ | 1 | $\underline{0}$ | $\underline{1}$ | $\underline{1}$ | $\underline{1}$ | $\underline{0}$ |
| $W_{4,4}^{[4]}$ | $x_1^l$ | $x_2^l$ | $\underline{1}$ | 1 | 0 | $x_1^l$ | $\underline{0}$ | $x_8^l$ | 1 | 0 | $\underline{0}$ | $x_2^l$ | 1 | $x_8^l$ | 1 | $\underline{0}$ | $x_1^r$ |
| | 0 | 1 | 1 | $\underline{1}$ | 0 | 1 | $\underline{0}$ | $\underline{0}$ | 1 | 1 | $\underline{0}$ | $x_2^r$ | $\underline{0}$ | $x_2^r$ | $\underline{1}$ | $x_2^r$ | $x_1^r$ |

FIG. 15B

| | $y_1^l$ | $y_2^l$ | $y_3^l$ | $y_4^l$ | $y_5^l$ | $y_6^l$ | $y_7^l$ | $y_8^l$ | $y_c$ | $y_8^r$ | $y_7^r$ | $y_6^r$ | $y_5^r$ | $y_4^r$ | $y_3^r$ | $y_2^r$ | $y_1^r$ |
|---|---|---|---|---|---|---|---|---|---|---|---|---|---|---|---|---|---|
| $W_{5,5}^{[1]}$ | 1 | 1 | 0 | 0 | 1 | 1 | 1 | 1 | 1 | 1 | 1 | 1 | 1 | 0 | 0 | $x_2^r$ | $x_1^r$ |
|  | 0 | −1 | −1 | −1 | 0 | −1 | −1 | 0 | −1 | 0 | −1 | −1 | −1 | −1 | 0 | $x_2^r$ | $x_1^r$ |
| $W_{5,5}^{[2]}$ | 1 | 1 | 0 | 0 | 1 | 1 | 1 | 1 | 1 | 1 | 1 | 1 | 1 | 0 | 1 | $x_2^r$ | $x_1^r$ |
|  | 0 | −1 | −1 | 0 | −1 | −1 | 0 | −1 | −1 | 0 | 0 | −1 | −1 | 0 | −1 | −1 | 0 |
| $W_{5,5}^{[3]}$ | $x_1^l$ | $x_2^l$ | $x_3^l$ | 0 | 1 | 1 | 1 | 1 | 1 | 1 | 1 | $x_2^r$ | $x_1^r$ | 0 | 0 | $x_2^r$ | $x_1^r$ |
|  | 0 | −1 | −1 | $x_1^l$ | $x_2^l$ | $x_3^l$ | 0 | 0 | −1 | 0 | 0 | $x_2^r$ | $x_1^r$ | 0 | −1 | −1 | 0 |
| $W_{4,4}^{[4]}$ | $x_1^l$ | $x_2^l$ | $x_3^l$ | 0 | $x_1^r$ | $x_2^r$ | 1 | 1 | 1 | 1 | 1 | 1 | 1 | $x_1^l$ | $x_2^l$ | $x_3^l$ | 0 |
|  | 0 | −1 | −1 | 0 | 0 | −1 | 0 | −1 | −1 | −1 | 0 | −1 | −1 | −1 | −1 | −1 | 0 |

FIG. 16

|  | FORMAT | USED | AVAILABLE |
|---|---|---|---|
| $\mathcal{M}_0$ | ······ 0 ······ | 37050 | 0 |
| $\mathcal{M}_1$ | ······ 110 ······ | 7900 | 0 |
| $\mathcal{M}_2$ | ······ 011 ······ | 7900 | 0 |
| $\mathcal{M}_3$ | ······ 10100 ······ | 2491 | 5 |
| $\mathcal{M}_4$ | ······ 00101 ······ | 2486 | 10 |
| $\mathcal{M}_5$ | ······ 01110 ······ | 2701 | 3 |
| $\mathcal{M}_6$ | ······ 00100 ······ | 2704 | 0 |
| $\mathcal{M}_7$ | ······ 10101 ······ | 2304 | 0 |

FIG. 17

| | |
|---|---|
| 10110110100111011 | 10011100101101110 |
| 10101110100111011 | 01101100101110101 |
| 10101110100111010 | 01011100101110101 |
| 10101110100110110 | 01011100101101110 |
| 10100110100111011 | 00011100101101110 |
| 11011100101110101 | 00011100101000100 |
| 11011100101101110 | 01101101110110110 |
| 11011100101101101 | 01101101110101110 |
| 11011100101100101 | 01101101110001110 |

FIG. 18A

| $y_1^l$ | $y_2^l$ | $y_3^l$ | $y_4^l$ | $y_5^l$ | $y_6^l$ | $y_7^l$ | $y_8^l$ | $y_c$ | $y_8^r$ | $y_7^r$ | $y_6^r$ | $y_5^r$ | $y_4^r$ | $y_3^r$ | $y_2^r$ | $y_1^r$ | W | SIZE |
|---|---|---|---|---|---|---|---|---|---|---|---|---|---|---|---|---|---|---|
| . | . | 0 | . | . | . | . | 0 | 1 | 1 | . | . | . | . | . | . | . | $W_{1,\{0,5\}}^{[2]}$ | 48 × 100 = 4800 |
| . | 0 | 1 | . | . | 0 | . | 0 | 1 | 1 | . | . | . | . | . | . | . | $W_{1,\{0,5\}}^{[1]}$ | 16 × 100 = 1600 |
| . | 0 | 1 | 0 | . | 1 | 0 | 0 | 1 | 1 | . | . | . | . | . | . | . | $W_{4,\{0,5\}}^{[1]}$ | 4 × 100 = 400 |
| . | 0 | 1 | 1 | 0 | 1 | 0 | 0 | 1 | 1 | . | . | . | . | . | . | . | $W_{4,\{0,5\}}^{[3]}$ | 2 × 100 = 200 |
| . | 1 | 1 | . | . | . | . | 0 | 1 | 1 | . | . | . | . | . | . | 0 | $W_{4,\{0,5\}}^{[4]}$ | 9 × 100 = 900 |

FIG. 18B

| $y_1^l$ | $y_2^l$ | $y_3^l$ | $y_4^l$ | $y_5^l$ | $y_6^l$ | $y_7^l$ | $y_8^l$ | $y_c$ | $y_8^r$ | $y_7^r$ | $y_6^r$ | $y_5^r$ | $y_4^r$ | $y_3^r$ | $y_2^r$ | $y_1^r$ | | SIZE |
|---|---|---|---|---|---|---|---|---|---|---|---|---|---|---|---|---|---|---|
| . | . | 0 | . | . | . | 0 | 0 | 1 | 0 | 0 | . | . | . | . | . | . | $W_{3,\{0,4,5\}}$ | 32 x 52 = 1664 |
| . | 0 | 1 | . | . | . | 0 | 0 | 1 | 0 | 0 | . | . | . | . | . | . | $W^{[2]}_{5,0}$ | 14 x 52 = 728 |
| 0 | 1 | 1 | . | . | . | 0 | 0 | 1 | 0 | 0 | . | . | . | 0 | . | . | $W^{[3]}_{4,1}$ | 6 x 32 = 192 |
| 0 | 1 | 1 | 0 | . | . | 0 | 0 | 1 | 0 | 0 | . | . | . | 1 | . | . | $W^{[2]}_{4,1}$ | 4 x 14 = 56 |
| 0 | 1 | 1 | 1 | 0 | . | 0 | 0 | 1 | 0 | 0 | . | . | 0 | 1 | 1 | . | $W^{[4]}_{4,4}$ | 2 x 14 = 28 |
| 0 | 1 | 1 | . | . | . | 0 | 0 | 1 | 0 | 0 | . | 0 | 1 | 1 | 1 | 0 | $W^{[3]}_{5,5}$ | 6 x 4 = 24 |
| 0 | 1 | 1 | 0 | 0 | . | 0 | 0 | 1 | 0 | 0 | . | 0 | 1 | 1 | 1 | 0 | $W^{[1]}_{4,1}$ | 4 x 2 = 8 |
| 0 | 1 | 1 | 1 | 0 | . | 0 | 0 | 1 | 0 | 0 | . | 0 | 1 | 1 | 1 | 0 | $W^{[1]}_{4,4}$ | 2 x 2 = 4 |

FIG. 18C

| $y_1^l$ | $y_2^l$ | $y_3^l$ | $y_4^l$ | $y_5^l$ | $y_6^l$ | $y_7^l$ | $y_8^l$ | $y_c$ | $y_8^r$ | $y_7^r$ | $y_6^r$ | $y_5^r$ | $y_4^r$ | $y_3^r$ | $y_2^r$ | $y_1^r$ | W | SIZE |
|---|---|---|---|---|---|---|---|---|---|---|---|---|---|---|---|---|---|---|
| . | . | 0 | . | . | . | . | . | . | . | . | . | . | . | . | . | . | $W_{2,\{0,4,5\}}^{[2]}$ | $28 \times 52 = 1456$ |
| . | 0 | 1 | . | . | . | 1 | 0 | 1 | 0 | 0 | . | 1 | 1 | . | . | . | $W_{0,0}^{[2]}$ | $.. \times .. = 52$ |
| 1 | 0 | 1 | . | . | . | 1 | 0 | 1 | 0 | 0 | 1 | 1 | 0 | 0 | . | . | $W_{0,0}^{[3]}$ | $.. \times .. = 48$ |
| . | 1 | 1 | 0 | . | . | 1 | 0 | 1 | 0 | 0 | 1 | 1 | . | . | . | . | $W_{5,0}^{[1]}$ | $.. \times .. = 623$ |
| 0 | 1 | 1 | 1 | 0 | . | 1 | 0 | 1 | 0 | 0 | . | . | . | . | . | . | $W_{2,\{0,4,5\}}^{[1]}$ | $4 \times 52 = 208$ |
| 0 | 1 | 1 | 1 | 0 | 1 | 1 | 0 | 1 | 0 | 0 | 1 | 1 | 1 | 0 | . | . | $W_{5,5}^{[1]}$ | $1 \times 4 = 4$ |
| 0 | 1 | 1 | 1 | 0 | . | 1 | 0 | 1 | 0 | 0 | . | . | . | . | . | . | $W_{4,\{0,5\}}^{[2]}$ | $.. \times .. = 100$ |

FIG. 19

| $i$ | $\#(k^{(0)}=i)$ | $\#(k_l^{(0)}=i)$ | $\#(k_r^{(0)}=i)$ | $i$ | $\#(k^{(0)}=i)$ | $\#(k_l^{(0)}=i)$ | $\#(k_r^{(0)}=i)$ |
|---|---|---|---|---|---|---|---|
| 0 | 0 | 28923 | 28925 | 9 | 509 | 93 | 93 |
| 1 | 758 | 17664 | 17661 | 10 | 144 | 0 | 0 |
| 2 | 12031 | 9167 | 9166 | 11 | 63 | 0 | 0 |
| 3 | 20199 | 4754 | 4756 | 12 | 26 | 0 | 0 |
| 4 | 15290 | 2467 | 2467 | 13 | 10 | 0 | 0 |
| 5 | 8735 | 1280 | 1280 | 14 | 4 | 0 | 0 |
| 6 | 4489 | 664 | 664 | 15 | 1 | 0 | 0 |
| 7 | 2210 | 345 | 345 | 16 | 0 | 0 | 0 |
| 8 | 1067 | 179 | 179 | 17 | 0 | 0 | 0 |

# METHODS AND APPARATUS FOR IMPLEMENTING RUN-LENGTH LIMITED AND MAXIMUM TRANSITION RUN CODES

FIELD OF THE INVENTION

The present invention relates generally to coding techniques, and more particularly to run-length limited (RLL) and maximum transition run (MTR) coding techniques for use in high density recording channels and other applications.

BACKGROUND OF THE INVENTION

A variety of block codes that fulfil certain channel input constraints have been developed for recording channels during the last several decades. One important category is the class of run-length limited (RLL) codes. The codewords of an RLL code are run-length limited binary sequences of a fixed length n, also known as (d,k) sequences, and are characterized by the parameters d and k, which indicate the minimum and maximum number of "zeros" between consecutive "ones" in the binary sequence, respectively. In magnetic recording applications, the binary sequence is mapped to a magnetization pattern along a track where every cell is fully magnetized in one of two possible directions, or equivalently, to a two-level sequence. One convention, commonly referred to as non-return-to-zero-inverse (NRZI) modulation, is to have a "one" correspond to a reversal of the direction of magnetization, i.e., a transition in magnetization between two bit cells, and to represent a "zero" as a non-reversal in magnetization, i.e., the absence of a transition. As a consequence, the parameter d controls the intersymbol interference (ISI) whenever peak detection is used to determine the transitions, since d defines the minimum distance between consecutive transitions. The parameter k defines the maximum distance between transitions and therefore determines the self-clocking properties of the sequence.

Current high-density recording systems generally use a detection technique that comprises partial response equalization with maximum-likelihood sequence detection, often referred to as PRML. By reconstructing the recorded sequence from sample values of a suitably equalized read-back channel, ISI can be handled. In the current systems a partial-response channel model with transfer function h(D)= (1−D)(1+D)N is generally used. The channel models with N≧2 are usually referred to as $E^{N-1}$PR4 channels.

For high density magnetic recording channels having high ISI, sequence detection can be enhanced by reducing the set of possible recording sequences in order to increase the minimum distance between those that remain. Often, to achieve this goal, a large fraction of the set of possible sequences has to be eliminated, which adversely affects the maximum achievable code rate. Pairs of sequences with minimum distance have been identified for important classes of partial-response channels and codes based on constrained systems have been proposed to increase the minimum distance between recorded sequences. See, e.g., E. Soljanin and A. J. van Wijngaarden, "On the Capacity of Distance Enhancing Constraints for High Density Magnetic Recording Channels," Proc. Workshop on Coding and Cryptography WCC'99, pp. 203–212, Paris, France, January 1999, which is incorporated by reference herein.

For the $E^2$PR4 channel, which is an appropriate model for the current generation of high density recording systems, the constraints that have been specified can be realized by restricting the maximum run-length of consecutive "ones." The corresponding codes, known as maximum transition run (MTR) codes, are equivalent to (0,k) RLL codes with interchanged "ones" and "zeros." By observing the constraints it becomes clear that a (0,2) MTR code will in any case be sufficient to increase the minimum distance. However, the capacity of a (0,2) code is only 0.8791. Higher rates can be achieved by specifying constraints that do not remove all undesired pairs but instead significantly reduce the number of undesired pairs of sequences with minimum distance. In this way, a trade-off is made between code rate, code complexity and detection performance.

In the construction of maximum (0,k) RLL codes, long sequences that fulfil the (0,k) constraints are typically constructed by concatenating the codewords of a (0,k,$k_l$,$k_r$) RLL constrained block code of length n, where $k_l$ and $k_r$ denote the maximum number of leading and trailing zeros of every codeword. By choosing $k_l+k_r \leq k$, the codewords can be concatenated without violating the global k constraint. In accordance with the above definition of MTR codes, (0,k,$k_l$,$k_r$) MTR codes are (0,k,$k_l$,$k_r$) RLL codes with interchanged "ones" and "zeros."

RLL codes are typically implemented with the use of look-up tables or with simple combinatorial circuitry. This imposes limitations on the block length n and consequently puts restrictions on the achievable efficiency of the codes for the given set of constraints. The majority of codes have a block length n≦9. Only recently have codes with longer block lengths been developed, often by interleaving an existing rate 8/9 code with uncoded bits, as described in, e.g., A. J. van Wijngaarden and K. A. S. Immink, "Combinatorial Construction of High Rate Runlength-limited Codes," IEEE Global Telecommun. Conf. Globecom'96, pp. 343–347, 1996. This has the advantage that the rate is increased without increasing error propagation. However, the constraints of the resulting code are in these cases loose and certainly not the best possible for the given rate.

Several new coding algorithms have been proposed to efficiently convert data words serially into codewords of high-rate constrained block codes. These algorithms are simple and have a linear complexity with word length n. It is therefore feasible to construct (0,k) codes with a code rate of 99% or more of the achievable capacity by using long codewords of several hundreds of bits. However, the practical application of these codes in recording systems is still limited, because most such systems have a separate device for modulation and error control. This configuration makes longer codes more vulnerable for error propagation. Other important concerns are delay and computational and hardware complexity.

There is currently a specific interest in high-rate constrained codes, e.g., rate 16/17, 24/25 and 32/33 constrained codes, with tight (0,k,$k_l$,$k_r$) constraints. However, it is generally not feasible to implement these high-rate codes as a look-up table, and integrating the code into a device usually requires a highly parallelized architecture with small delay and high throughput. Conventional codes and code generation techniques have not adequately addressed these and other problems associated with high-rate codes.

SUMMARY OF THE INVENTION

The present invention provides improved constraints and techniques for the construction of efficient, high-rate, multi-purpose run-length limited (RLL) and maximum transition run (MTR) block codes.

In accordance with a first aspect of the invention, a number of new constraints for use in generating RLL and MTR codes are provided. These constraints include, e.g., an F={1111, 11100} NRZI strong constraint, an F={1111, 00111} NRZI strong constraint, an F={1111, 11100$_{odd}$, 00111$_{odd}$} NRZI strong constraint, an F={1111} NRZI weak constraint, an F={11111} NRZI weak constraint, and an F={1010} NRZ weak constraint, where F denotes a list of forbidden strings, and NRZI or NRZ specifies the modulation format.

In accordance with another aspect of the invention, high-rate codes are generated which satisfy one or more of the above-noted constraints. The code generation process first partitions each of a set of data words and a set of codewords into a number of disjoint subsets. A distinct mapping is then generated between a given subset of the data words and a corresponding subset of the codewords. A given data word is converted to a codeword by applying to the given data word the mapping associated with the subset containing that data word. The mappings are configured to utilize symmetry whenever possible. For example, if Y=ψ(X) represents the mapping of a given data word X onto a corresponding codeword Y. then it is preferred that X' and Y representing the words X and Y in reversed order, satisfy the relation Y'=ψ(X'). An example of an efficient, high-rate, multi-purpose code in accordance with the invention is a rate 16/17 code satisfying (0,15,9,9) RLL and (0,3,2,2) MTR constraints. This exemplary code can be further processed using interleaving techniques to generate other higher rate codes, e.g., a rate 48/49, (0,11,6,6) code can be generated by interleaving symbols of the above-noted rate 16/17, (0,3,2,2) code with uncoded bits of a data word, and a rate 32/33, (0,7,4,4) code can be generated by interleaving symbols of the rate 16/17, (0,3,2,2) code with uncoded bits of a data word.

Advantageously, the invention provides techniques for generating high-rate, multi-purpose distance-enhancing codes with improved timing and gain control. Codes generated using these techniques exhibit improved performance, improved immunity to noise and ISI, and a more efficient encoder and decoder architecture than conventional codes. The codes and code generation techniques of the invention can be used in a wide variety of systems, e.g., high-density magnetic and optical recording systems, data transmission systems, etc.

BRIEF DESCRIPTION OF THE DRAWINGS

FIG. 1 shows an exemplary system in which the coding techniques of the invention may be implemented.

FIGS. 2A–2C show, for an F={1111, 11100} NRZI strong constraint, strings eliminated by the constraint, a graph representation of the constraint, and its adjacency matrix and corresponding capacity, respectively.

FIGS. 8 through 19 show tables illustrating different aspects of an exemplary MTR-RLL code in accordance with the invention.

DETAILED DESCRIPTION OF THE INVENTION

Figures 3A, 3B, 3C:
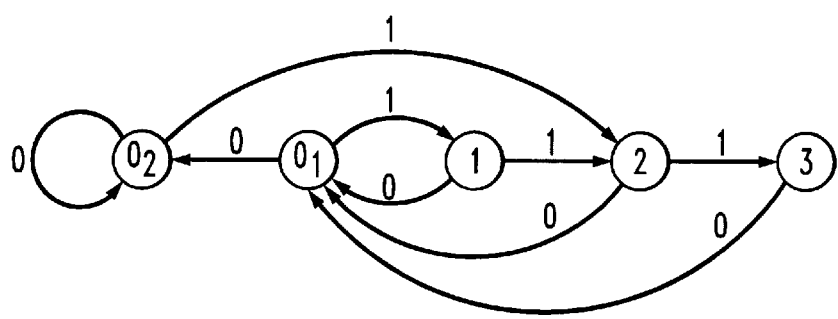
FIGS. 3A–3C show, for an F={1111, 00111} NRZI strong constraint, strings eliminated by the constraint, a graph representation of the constraint, and its adjacency matrix and corresponding capacity, respectively.

FIG. 1 shows a coding system 10 in which the coding techniques of the invention may be implemented. The coding system 10 includes a data source 12, an encoder 14, a channel 16, a decoder 18 and an output device 20. Binary information from the data source 12 is supplied to the encoder 14 and block encoded using an RLL or MTR code in accordance with the invention. The codes and coding techniques of the invention will be described in greater detail below. The encoded sequences at the output of encoder 14 are supplied to channel 16, e.g., for recording on a magnetic, optical, electronic or other type of recording medium, for transmission through a communication medium, or for further processing, e.g., modulation into NRZI format or other desired format, prior to recording, transmission, or other operations. The channel 16 may thus represent a recording medium, a communication medium, additional processing circuitry, as well as combinations of these and other types of elements. Encoded sequences received from the channel 16 are applied to the decoder 18, and decoded to recover the original binary information. This information may then be supplied to an output device for further processing as required in a given application.

The system 10 may be implemented at least in part as a processor-based system such as a personal, micro or mainframe computer, a workstation, a microprocessor, a central processing unit, an application-specific integrated circuit (ASIC) or other digital data processor, as well as various portions or combinations thereof. In such a system, a processor may interact with one or more memory elements to execute stored software programs to carry out the various system functions. For example, the operations of the encoder 14 and the decoder 18 may be implemented in software executed by a processor associated with the system 10. Such a processor may also be used to implement one or more processing functions associated with the channel 16. For example, in an embodiment in which the channel 16 includes a communication medium, the processor may provide, e.g., modulation, framing, packetization or other similar operations for formatting the encoded sequences for transmission over a local area network, a wide area network, a global data communications network such as the Internet, a private "intranet" network or any other suitable data communication medium.

A first aspect of the invention provides improved distance-enhancing constraints particularly well suited for use in generating high-rate RLL or MTR codes for high density recording channels. This aspect of the invention identifies constraints which recorded sequences have to satisfy to guarantee that the minimum distance between them is larger than for a corresponding uncoded system. This aspect of the invention also identifies constraints for which the minimum distance between sequences may be the same as for the uncoded system but the number of pairs of sequences at the minimum distance is smaller.

Constrained codes are most often derived based on constrained systems of finite type (FT). An FT system X over alphabet A can always be characterized by a finite list of forbidden strings $F=\{w_1, \ldots, w_N\}$ of symbols in A. Such an FT system will be denoted $X_F^A$. A set of constraints for a binary channel can be written in the form of a directed graph with a finite number of states and edges, and edge labels drawn from the binary alphabet. The set of corresponding constrained sequences is obtained by reading the labels of paths through the graph. A constrained code C, $C \subset X_F^{\{0,1\}}$ can be constructed based on a graph representation of $X_F^{\{0,1\}}$ using the well-known state splitting algorithm, as described in, e.g., R. Adler, D. Coppersmith and M. Hassner, "Algorithms for sliding-block codes," IEEE Trans. Inform. Theory, Vol. 29, No. 1, pp. 5–22, January 1983.

Translation of constrained sequences into channel sequences depends on the modulation method. For magnetic recording channels, the previously-described NRZI modulation records a "one" as a transition in cell magnetization, and a "zero" as the absence of a transition, while in NRZ modulation a "one" is a given direction of magnetization, and "zero" is the opposite magnetization direction. A channel constraint which forbids transitions in two neighboring bit cells for the case of NRZI modulation can be written as F={11} NRZI.

The maximum rate of a code in a constrained system is determined by its Shannon capacity. The Shannon capacity C of a constrained system is defined as $$C = \lim_{n \to \infty} \frac{\log_2 N(n)}{n},$$

where N(n) is the number of sequences of length n. The capacity of an FT constrained system represented by a graph G can be easily computed from an adjacency matrix, i.e., state transition matrix, of G. The adjacency matrix A of graph G with r states and $a_{ij}$ edges from state i to state j, where $1 \leq i$ and $j \leq r$, is the rxr matrix $A=A(G)=\{a_{ij}\}_{r \times r}$. The Shannon capacity of G is given by $$C = \log_2 \lambda(A),$$

where $\lambda(A)$ is the largest real eigenvalue of A.

Constrained codes can be used to provide coding gain on channels with high ISI, as will now be described in greater detail. The minimum distance of the uncoded binary channel with transfer function h(D) is defined by $$d_{\min}^2 = \min_{\varepsilon(D) \neq 0} \|h(D)\varepsilon(D)\|^2$$

where $$\varepsilon(D) = \sum_{i=0}^{l-1} \varepsilon_i D^i,$$

and $\varepsilon_i \in \{-1, 0, 1\}$, $\varepsilon_0 = 1$, $\varepsilon_{l-1} \neq 0$, is the polynomial corresponding to a normalized input error sequence $$\varepsilon = \{\varepsilon_i\}_{i=0}^{l-1}$$

of length l, and the squared norm of a polynomial is defined as the sum of its squared coefficients. The minimum distance is bounded from above by $\|h(D)\|^2$, denoted by $$d_{MFB}^2 = \|h(D)\|^2. \quad (1)$$

This bound is known as the matched-filter bound (MFB), and is achieved when the error sequence of length l=1, i.e., $\varepsilon(D)=1$, is in the set $$\arg \min_{\varepsilon(D) \neq 0} \|h(D)\varepsilon(D)\|^2. \quad (2)$$

For channels that fail to achieve the MFB, i.e., for which $$d_{MFB}^2 < \|h(D)\|^2,$$

error sequences $\varepsilon(D)$ for which $$d_{\min}^2 \leq \|h(D)\varepsilon(D)\|^2 < \|h(D)\|^2 \quad (3)$$

are of length $l \geq 2$ and may belong to a constrained system $X_L^{\{-1,0,1\}}$, where L is an appropriately chosen finite list of forbidden strings.

For code C, the set of all admissible non-zero error sequences are defined as $$E(C)=\{\varepsilon=\{e_i\}|e_i \in \{-1,0,1\}, e_0=1, \varepsilon=a-b, a,b \in C\}.$$

Given the condition $E(C) \subseteq X_L^{\{-1,0,1\}}$, the objective is to identify the least restrictive finite list F of blocks over the alphabet {0,1} so that $$C \subseteq X_F^{\{0,1\}} \Rightarrow E(C) \subseteq X_L^{\{-1,0,1\}}. \quad (4)$$

A constrained code is defined by specifying F, the list of forbidden strings for code sequences. Prior to that one needs to first characterize error sequences that satisfy (3) and then specify L, the list of forbidden strings for error sequences. Error event characterization can be done by using known methods, and specification of L is usually straightforward. One possible way to construct the list F based on the list L is as follows. From the above definition of error sequences $\varepsilon = \{e_i\}$ it can be seen that see that $e_i=1$ requires $a_i=1$ and $e_i=-1$ requires $a_i=0$, i.e., $a_i=(1+e_i)/2$. For each block $w_e \in L$, construct a list $F_{w_e}$ of blocks of the same length l according to the rule:

$$F_w = \{w_C \in \{-1, 1\}^l | w_C^i = (1+w_e^i)/2 \text{ for all i for which } w_e^i \neq 0\}.$$

Then the list F obtained as $$F = \bigcup_{w_\varepsilon \in L} F_{w_\varepsilon}$$

satisfies equation (4). However, the constrained system $X_F^{\{0,1\}}$ obtained this way may not be the most efficient.

A number of constraints in accordance with the invention will now be presented in conjunction with FIGS. 2 through 7. These constraints are illustrated for the above-noted $E^2PR4$ channel, for which the transfer function is h(D)=(1–

D)$(1+D)^3$, and its MFB, determined by $\epsilon(D)=1$, is $\|(1-D)(1+D)^3 \cdot 1\|=10$. The list L of forbidden error strings is given by L={+−+00,+−+−}, where + denotes 1 and − denotes −1. In each case, the constraints are obtained as follows. For each of the error strings in list L, all pairs of channel strings whose difference is the error string are determined. The list F is then determined by searching for the longest string(s) appearing in at least one of the strings in each channel pair. The list F specifies the necessary conditions that have to be satisfied in order to achieve the matched filter bound for the $E^2PR4$ channel.

Figures 4A, 4B:
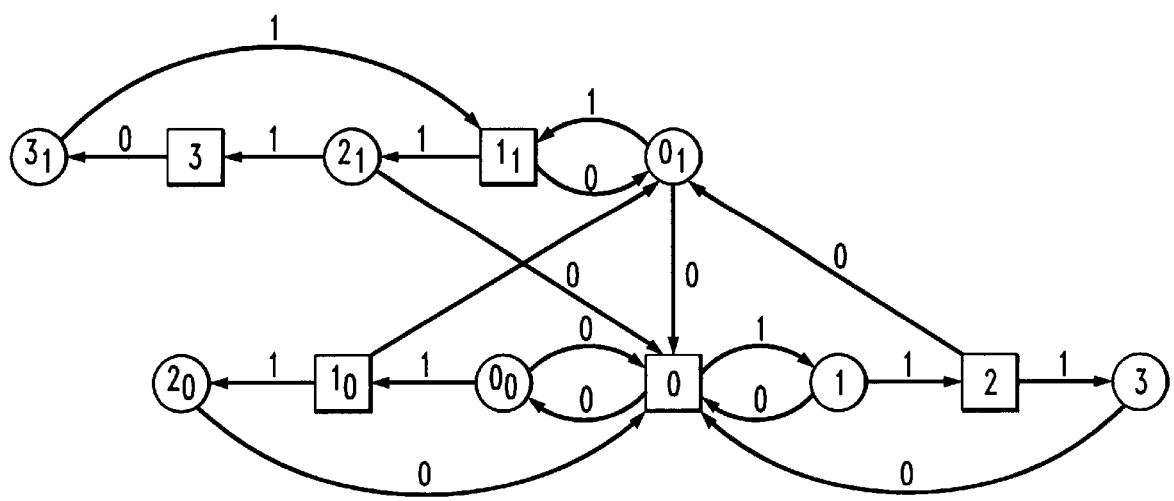
FIGS. 4A–4D show, for an F={1111,11100$_{odd}$, 00111$_{odd}$} NRZI strong constraint, strings eliminated by the constraint, a graph representation of the constraint definition, a graph representation with the minimal number of states, and the adjacency matrix and corresponding capacity of the constraint, respectively.
Figures 4C, 4D:
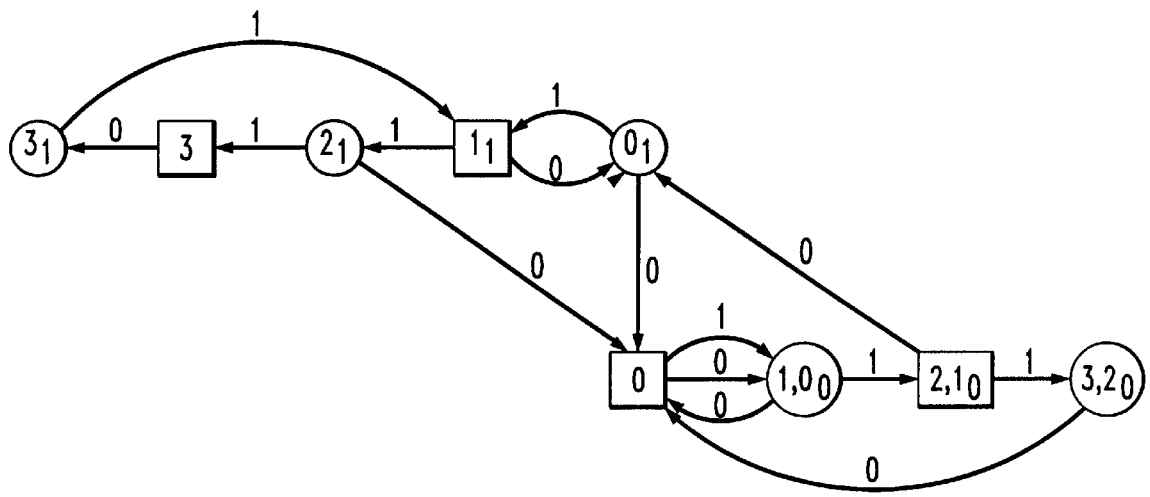
Figures 5A, 5B, 5C:
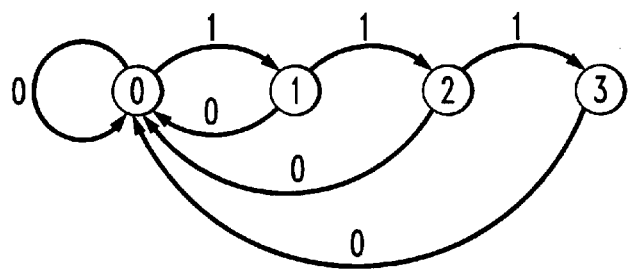
FIGS. 5A–5C show, for an F={1111} NRZI weak constraint, strings eliminated by the constraint, a graph representation of the constraint, and its adjacency matrix and corresponding capacity, respectively.
Figures 6A, 6B, 6C:
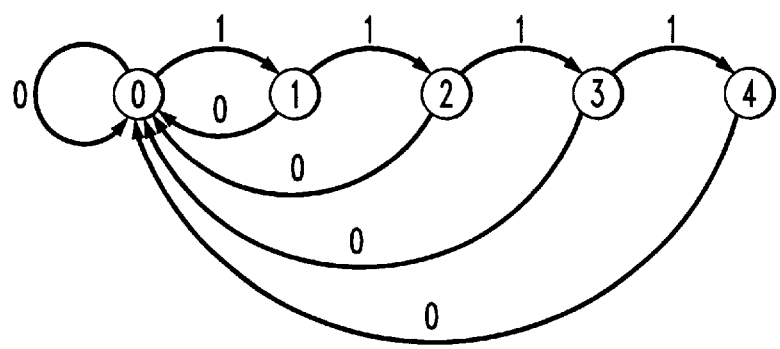
FIGS. 6A–6C show, for an F={11111} NRZI weak constraint, strings eliminated by the constraint, a graph representation of the constraint, and its adjacency matrix and corresponding capacity, respectively.
Figures 7A, 7B, 7C:
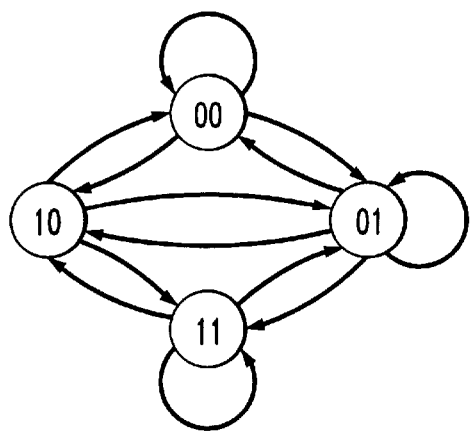
FIGS. 7A–7C show, for an F={1010} NRZ weak constraint, strings eliminated by the constraint, a graph representation of the constraint, and its adjacency matrix and corresponding capacity, respectively.
Figure 20:
FIGS. 20 through 25 illustrate the manner in which alternative higher rate codes can be generated from the exemplary MTR-RLL code illustrated in conjunction with FIGS. 8 through 19.
Figure 21:

FIGS. 2A–2C, 3A–3C, 4A–4D, 5A–5C, 6A–6C and 7A–7C illustrate the constraints in greater detail. These six sets of figures correspond to an F={1111, 11100} NRZI strong constraint, an F={1111, 00111} NRZI strong constraint, an F={1111, 11100$_{odd}$, 00111$_{odd}$} NRZI strong constraint, an F={1111} NRZI weak constraint, an F={11111} NRZI weak constraint, and an F={1010} NRZ weak constraint, respectively. The strong constraints remove all channel pairs involved in forming the above-noted error event +−+00, while the weak constraints do not remove all channel pairs involved in forming the error event +−+00. Each of the six sets of figures shows the strings eliminated by the constraint for channel pairs a and b (FIGS. 2A, 3A, 4A, 5A, 6A and 7A), a graph representation of the constraint (FIGS. 2B, 3B, 4B, 5B, 6B and 7B), and the adjacency matrix A and corresponding capacity C associated with the constraint (FIGS. 2C, 3C, 4D, 5C, 6C and 7C). FIG. 4C shows a graph representation with the minimal number of states for the F={1111, 11100$_{odd}$, 00111$_{odd}$} NRZI strong constraint.

The above-described constraints can be used to design efficient high-rate RLL and MTR codes in accordance with the invention. By way of example, it will be described in detail below the manner in which rate 16/17, (0,3,2,2) MTR codes that also fulfil (0,15,9,9) RLL constraints can be generated from the F={1111} NRZI and F={11111} NRZI weak constraints illustrated in conjunction with FIGS. 5A–5C and 6A–6C. In order to generate the rate 16/17 block codes satisfying the F={1111} NRZI and F={11111} NRZI weak constraints, the codewords are permitted to have strings 11 at the beginning and the end of the codewords. Therefore, the resulting codes permit the string 1111 at transitions between codewords. It will be apparent to those skilled in the art that the other constraints described herein can be similarly processed to generate other codes.

As noted above, in the construction of maximum (0,k) RLL codes, long sequences that fulfil the (0,k) constraints are typically constructed by concatenating the codewords of a $(0,k,k_l,k_r)$ RLL constrained block code of length n, where $k_l$ and $k_r$ denote the maximum number of leading and trailing zeros of every codeword. By choosing $k_l+k_r<k$, the codewords can be concatenated without violating the global k constraint. Also as previously noted, $(0,k,k_l,k_r)$ MTR codes correspond to $(0,k,k_l,k_r)$ RLL codes with interchanged "ones" and "zeros."

The set of binary sequences of a fixed length that fulfil given $(0,k,k_l,k_r)$ constraints can be determined recursively. Before the recursive relations are described, the following notation is introduced. Let $A^m$ denote the set of binary sequences of length m. A run of s consecutive symbols a is written as $a^s$. The character * is used to denote an arbitrary symbol of A. The sequence $(*)^s$ represents an arbitrary element of $A^s$. A sequence $X \in A^m$ will be often represented as a string of binary symbols $x_1 x_2 \ldots x_m$. Define $H^{(m)} \subseteq A^m$ to be a set of sequences of length m. The concatenation of two sequences X and Y is denoted by XY, and $PH^{(m)}$ denotes a set of sequences of length p+m with prefix $P \in A^p$ and suffix Y, where $Y \in H^{(m)}$, in short, $PH^{(m)}=\{PY|Y \in H^{(m)}\}$. Similarly, $H^{(m)}S=\{YS|Y \in H^{(m)}\}$. The null string, denoted by $\Lambda$, is introduced to represent a string of length 0, for which the equation $\Lambda X=X\Lambda=X$ holds.

Let $$G^{(n)}_{k,k_l,k_r}$$

denote the set of sequences of length n that satisfy the $(0,k,k_l,k_r)$ constraints on the runs of consecutive zeros, where $k_l \leq k$ and $k_r < k$. The number of elements of $$G^{(n)}_{k,k_l,k_r},$$

denoted by $$G^{(n)}_{k,k_l,k_r},$$

can be determined recursively. For $n \leq \min(k_l,k_r)$, $$G^{(n)}_{k,k_l,k_r} = A^n$$

and $$G^{(n)}_{k,k_l,k_r} = 2^n.$$

For $n>k_l$, the set $$G^{(n)}_{k,k_l,k_r}$$

satisfies the recursion relation $$G^{(n)}_{k,k_l,k_r} = \bigcup_{i=0}^{k_l} 1^i 0 G^{(n-i-1)}_{k,k,k_r}. \tag{5}$$

The set $$G^{(t)}_{k,k,k_r},$$

where, as indicated, $k_l=k$, can be determined using the same recursion relation for any value of $t \geq k+2$. For $t \leq k_r$, $$G^{(t)}_{k,k,k_r} = A^t,$$

and for $t=k_r+1$, $$G^{(t)}_{k,k,k_r} = A^t \setminus \{1^{k_r+1}\}.$$

For $k_r+2 \leq t \leq k+1$, it can be shown that $$G^{(t)}_{k,k,k_r} = 0 G^{(t-1)}_{k,k,k_r} \cup 1 G^{(t-1)}_{k,k,k_r}.$$

For $t \leq k+1$, the value of $$G^{(t)}_{k,k,k_r}$$

is given by $$G^{(t)}_{k,k,k_r} = \begin{cases} 2^t & \text{if } t \leq k_r \\ 2^{t-k_r-1}(2^{k_r+1}-1) & \text{if } k_r < t \leq k+1 \end{cases}$$

For $n \geq k+2$, since the union of the sets in (5) is disjoint, the recursion relation is given by $$G^{(n)}_{k,k_l,k_r} = \sum_{i=0}^{k_l} G^{(n-i-1)}_{k,k,k_r}.$$

In a similar fashion, $$F^{(n)}_{k,k_l,k_r}$$

is defined as the set of sequences of length n that satisfy the $(0,k,k_l,k_r)$ constraints on the runs of consecutive zeros, and denote $$F^{(n)}_{k,k_l,k_r}$$

as the size of $$F^{(n)}_{k,k_l,k_r}.$$

Reversing the zeros and the ones in the above derivation yields expressions for $$F^{(n)}_{k,k_l,k_r}$$

and $$F^{(n)}_{k,k_l,k_r}$$

that are identical to those given previously for $$G^{(n)}_{k,k_l,k_r} \text{ and } G^{(n)}_{k,k_l,k_r}.$$

As will be illustrated below, these expressions can be used to determine the number of subsequences of a given length that satisfy given $(0,k,k_l,k_r)$ constraints.

An efficient methodology for the construction of $(0,k,k_l,k_r)$ codes in accordance with the invention involves mapping $(n-1)$-bit data words onto n-bit codewords of a $(0,k,k_l,k_r)$ code. If the number of sequences of length n that satisfy the $(0,k,k_l,k_r)$ constraints exceeds $2^{n-1}$, it is always possible to perform this mapping, although the complexity may be high. For several codeword lengths it is possible to realize this mapping procedure using a small digital combinatorial circuit. The codes to be described below in conjunction with an illustrative embodiment of the invention are characterized by a set of data-dependent mapping rules. The encoder first checks whether the data word would be a valid codeword. If this is the case, the encoder copies the data word and inserts one extra bit that indicates that the other bits of the codeword are a copy of the data word. Otherwise, the extra bit indicates that a mapping rule had to be applied to transform the data word into an $(n-1)$-bit coded sequence that satisfies the imposed $(0,k,k_l,k_r)$ constraints. The coded sequence, which uniquely represents the data word, comprises bits which identify the mapping used, and rearranged data bits. The mapping structure is preferably symmetric to simplify the design process and the structure of the digital combinatorial circuitry.

The above-described code construction methodology of the present invention has the following characteristics:

1. A mapping is defined for a set of data words rather than for one word. Based on the specific constraints, the set of data words and the set of codewords are partitioned into disjoint subsets. For every set a mapping is specified. The words belonging to the same subset are transformed in the same fashion.

2. Symmetry is used whenever possible, i.e., if $Y=\psi(X)$ represents the mapping of X onto Y. then X' and Y', representing the words X and Y in reversed order, satisfy whenever possible the relation $Y'=\psi(X')$. This significantly simplifies the design.

3. The relative position of the information bits is changed only if necessary. Whenever changes are necessary to fulfil the constraints, the data symbols are permuted instead of transformed.

4. The translation of $(n-1)$ information bits into n-bit codewords and vice versa is done in parallel.

5. The combinatorial circuitry that results from the methodology classifies the incoming data word, and rearranges the data bits based on the classification in order to satisfy the constraints.

The methodology given above is particularly well suited for the construction of tightly constrained codes with a short and medium wordlength, e.g., a wordlength of 4 to 32 bits, and possibly up to 64 bits with slightly looser constraints. The constructed codes can also be used as a basic code to obtain longer and higher rate codes with less tight constraints by using interleaving with uncoded data symbols.

The design of a rate 16/17, (0,3,2,2) MTR, (0,15,9,9) RLL code in accordance with the invention will now be described in detail. The objective is to construct a code C that is a subset of $$G^{(17)}_{3,2,2}$$

and has a cardinality $2^{16}$. Since $$G^{(17)}_{3,2,2} = 65753,$$

there is a surplus of 217 codewords. The surplus codewords allow one to simultaneously fulfil (0,15,9,9) RLL constraints by excluding 199 words to obtain a code $$C \subset G^{(17)}_{3,2,2} \cap F^{(17)}_{15,9,9}$$

with a surplus of 18 candidate words.

An illustrative technique of mapping source words onto codewords that fulfil both the (0,3,2,2) MTR constraints and the (0,15,9,9) RLL constraints will now be described. As will be appreciated by those skilled in the art, this technique inherently specifies the structure of the encoder and decoder that map 16-bit data words in parallel onto 17-bit codewords and vice versa.

In the mapping technique, the symmetry relative to the central position of the codeword plays an important role. Let $Y=y_1 y_2 \ldots y_{17}$ be an arbitrary element of $A^{17}$ and denote $Y'=y_{17} \ldots y_2 y_1$ to be the sequence Y in reversed order. The set $$G_{3,2,2}^{(17)} \cap F_{15,9,9}^{(17)}$$

has the property that $$Y \in G_{3,2,2}^{(17)} \cap F_{15,9,9}^{(17)}$$

if and only if $$Y' \in G_{3,2,2}^{(17)} \cap F_{15,9,9}^{(17)}.$$

Let $Y=\psi(X)$ denote the mapping of a 16-bit data word onto a 17-bit codeword. Whenever possible, Y ' will be the codeword associated with X', i.e., $Y'=\psi(X')$. This will help to reduce the complexity of the analysis and the design.

Let $X \in A^{16}$ denote the 16-bit source word. The above-noted symmetry is taken into account by decomposing X into two sequences $X^l = x_1^l x_1^l \ldots x_8^l$ and $X^r = x_1^r x_2^r \ldots x_8^r$, where $X^l \in A^8$ and $X^r \in A^8$. Let $X^{r'}$ be the sequence $X_r$ in reversed order, i.e., $X^{r'} = x_8^r x_7^r \ldots x_1^r$. The source word X is given by $$X = X^l X^r = x_1^l x_2^l x_3^l x_4^l x_5^l x_6^l x_7^l x_8^l x_8^r x_7^r x_6^r x_5^r x_4^r x_3^r x_2^r x_1^r$$

Let Y denote the codeword, where the symbols are indexed as follows $$Y = y_1' y_2' y_3' y_4' y_5' y_6' y_7' y_8' y_c y_8' y_7' y_6' y_5' y_4' y_3' y_2' y_1'$$

where $y_c$ denotes the central position of the 17-bit codeword. The indices reflect the symmetry relative to the central position of the codeword.

Consider the 17-bit word $Y = X^l 0 X^{r'}$, i.e., $y_i' = x_i^l$, $y_i^r = x_i^r$ for $1 \leq i \leq 8$, and $y_c = 0$. It can be verified that $$Y \in G_{3,2,2}^{(17)}$$

if and only if $$X^l \in G_{3,2,3}^{(8)}$$

and $$X^{r'} \in G_{3,3,2}^{(8)},$$

i.e., $$X^r \in G_{3,2,3}^{(8)}.$$

Let $$V_0 = G_{3,2,3}^{(8)}$$

denote the set of words of length 8 that fulfil the (0,3,2,3) MTR constraints. The set $A^8 \setminus V_0$ is partitioned into five disjoint subsets $V_1, \ldots, V_5$, which are specified in the table of FIG. 8. Every set $V_i$, $1 \leq i \leq 5$, consists of words that have a substring that violates the imposed (0,3,2,3) MTR constraints in common. Define $V_i$ to be the size of the set $V_i$. The values of $V_1$ through $V_5$ are specified in the last column of the table in FIG. 8. The size of $V_0$ is given by $$V_0 = G_{3,2,3}^{(8)} = 193.$$

Since the six sets $V_0, V_1, \ldots, V_5$ are disjoint and their union equals $A^8$, every data word $X \in A^{16}$ can be represented by $X = X^l X^r$, where $X^l \in V_i$ and $X^r \in V_j$. The sets $W_{i,j} = V_i \times V_j$ are disjoint and therefore the set of data words $A^{16}$ is uniquely partitioned. This implies that there are 36 different sets $W_{i,j}$ that have to be considered. Define $W_{i,j}$ to be the number of elements in the set $W_{i,j}$. FIG. 9 shows a table listing the values of $W_{i,j} = V_i V_j$ for each of the 36 sets $W_{i,j}$. It can be verified that, as expected, the sum of the values $W_{i,j}$ that are given in the table of FIG. 9 is equal to 65536, i.e., $2^{16}$.

To determine to which set $V_i$ a word $X \in A^8$ belongs to, one can evaluate the following set of equations, which are obtained from the table in FIG. 8:

$$v_1 = x_1 \cdot x_2 \cdot x_3$$
$$v_2 = \bar{x}_1 \cdot x_2 \cdot x_3 \cdot x_4 \cdot x_5$$
$$v_3 = \bar{x}_2 \cdot x_3 \cdot x_4 \cdot x_5 \cdot x_6$$
$$v_4 = \bar{x}_3 \cdot x_4 \cdot x_5 \cdot x_6 \cdot x_7$$
$$v_5 = \bar{x}_4 \cdot x_5 \cdot x_6 \cdot x_7 \cdot x_8 \cdot \bar{v}_1$$
$$v_0 = \bar{v}_1 \cdot \bar{v}_2 \cdot \bar{v}_3 \cdot \bar{v}_4 \cdot \bar{v}_5$$

where $\bar{x}_i$ denotes the inverse of the binary value $x_i$ and the "." operator denotes the binary AND operation.

Exactly one out of the six binary values $v_0, \ldots, v_5$ will be non-zero. In order to determine the particular set $W_{i,j}$ that a given data word X belongs to, this set of equations is evaluated for $X^l$ and $X^r$. It is often necessary to further partition the sets $W_{i,j}$ into $P_{i,j}$ disjoint subsets, denoted by $W_{i,j}^{[p]}$, where $1 \leq p \leq P_{i,j}$. These partitions have the property that $$W_{i,j}^{[p]} \subseteq W_{i,j} \setminus \bigcup_{s=1}^{p-1} W_{i,j}^{[s]} \tag{6}$$

and $$W_{i,j} = \bigcup_{p=1}^{P_{i,j}} W_{i,j}^{[p]}. \tag{7}$$

The set $$G_{3,2,2}^{(17)}$$

will be partitioned into eight disjoint subsets $M_0, \ldots, M_7$ which are specified in the table of FIG. 10. The dots in this table are placeholders for binary symbols of elements of the set specified in the third column of the table. It can be seen that all the possible combinations of the central positions are specified. The rightmost column gives the number of codewords of $M_i$. The sum of the last column equals $$G^{(17)}_{3,2,2} = 65753.$$

Because of the symmetry of the central positions, $|M_{2m-1}|=|M_{2m}|$ for $1 \leq m \leq 3$. The sets $M_i$, where $1 \leq i \leq 7$, automatically fulfil the (0,15,9,9) RLL constraints in addition to the (0,3,2,2) MTR constraints.

Having completed partitioning the set of data words and the set of candidate codewords, the next step is to specify the assignment of codewords to data words in a compact format by mappings which inherently define the encoder and the decoder.

The mapping of a set of data words $X \in W_{i,j}{}^{[p]}$ onto a set of codewords $Y \in M$ is specified by the templates $X_{i,j[p]}$ and $Y_{i,j[p]}$. The first string, $X_{i,j[p]}$, specifies the set $W_{i,j}{}^{[p]}$ by indicating the relative positions of zeros, ones and data symbols. The second string, $Y_{i,j[p]}$, specifies the subset of $M_s$ onto which the elements of $X \in W_{i,j}{}^{[p]}$ are mapped.

In the illustrative embodiment, central positions of which the rightmost position is a zero and the leftmost position a one indicate a violation at the lefthand side. This makes it straightforward to use the symmetry and the central positions in reversed order to handle the violations at the righthand side. It will be shown that it is possible to specify one mapping for several sets $W_{i,j}$. The elements X of the sets $W_{i,0}$, where $1 \leq i \leq 5$, will be mapped onto elements of the sets $M_1$, $M_3$ and M5.

The mapping of an element $X \in W_{i,j}{}^{[p]}$ onto an element $Y \in M_{2m-1}$ where $1 \leq m \leq 3$ almost always implies that the element $X' \in W_{i,j}{}^{[p]}$ will be mapped onto the element $Y' \in M_{2m}$. Whenever this is the case, the mapping will be marked with an S.

Consider first the mapping of elements $X \in W_{0,0}$ which is specified in a compact format in the table of FIG. 11. The elements $X \in W_{0,0}$ are mapped onto the elements of $M_0$, unless the (0,15,9,9) RLL constraints are violated. The table of FIG. 11 specifies the subsets $W_{0,0}{}^{[1]}$ up to $W_{0,0}{}^{[4]}$ for which the (0,15,9,9) RLL constraints would be violated. The subsequences that violate the constraints are shown in bold-face type in the table to emphasize the kind of violation that is under consideration. The underlined zeros and ones in the template Y indicate which positions uniquely specify the mapping. The decoder checks these positions, and if there is a match, the mapping will be reversed to reconstruct the data word.

The mapping of the elements $X \in W_{0,0}{}^{[1]}$ will now be considered in more detail. The template X specifies the additional constraints that are imposed. Since $X^l \in V_0$, the data sequence $$x_1^l x_2^l \ldots x_6^l \in G^{(6)}_{3,2,2}.$$

In other words, X specifies $$G^{(6)}_{3,2,2}$$

48 different data words. The template Y specifies the corresponding codewords. Since sequence $$x_1^l x_2^l \ldots x_6^l \in G^{(6)}_{3,2,2},$$

the subsequence $$x_1^l x_2^l x_3^l \neq 111$$

and the subsequence $$x_4^l x_5^l x_6^l \neq 111.$$

This guarantees that the words corresponding to template Y satisfy the imposed constraints.

The five mappings in the table of FIG. 11 specify the transformation of $W_{0,0}=37249$ data words into codewords. All the elements of $M_0$ are paired with data words. Let $$z^l = \bar{x}_1^l \cdot \bar{x}_2^l \cdot \bar{x}_3^l \cdot \bar{x}_4^l \cdot \bar{x}_5^l \cdot \bar{x}_6^l \cdot \bar{x}_7^l \cdot \bar{x}_8^l \cdot \bar{x}_8^r$$

and $$z^r = \bar{x}_1^r \cdot \bar{x}_2^r \cdot \bar{x}_3^r \cdot \bar{x}_4^r \cdot \bar{x}_5^r \cdot \bar{x}_6^r \cdot \bar{x}_7^r \cdot \bar{x}_8^r \cdot \bar{x}_8^r.$$

To determine to which set $W_{0,0}{}^{[i]}$ a word $X \in W_{0,0}$ belongs to, one can evaluate the following set of equations, which are directly obtained from the table in FIG. 11:

$$w_{0,0[1]} = v_0^l \cdot v_0^r \cdot x_7^l \cdot z^r$$

$$w_{0,0[2]} = v_0^l \cdot v_0^r \cdot \bar{x}_7^l \cdot z^r$$

$$w_{0,0[3]} = v_0^l \cdot v_0^r \cdot x_7^r \cdot z^l$$

$$w_{0,0[4]} = v_0^l \cdot v_0^r \cdot \bar{x}_7^r \cdot z^l \cdot \bar{w}_{0,0[1]}$$

$$w_{0,0[5]} = v_0^l \cdot v_0^r \cdot \bar{w}_{0,0[1]} \cdot \bar{w}_{0,0[2]} \cdot \bar{w}_{0,0[3]} \cdot \bar{w}_{0,0[4]}$$

It can be verified that exactly one out of the five binary values $w_{0,0[1]}, \ldots, w_{0,0[5]}$ will be non-zero.

Figure 12A:
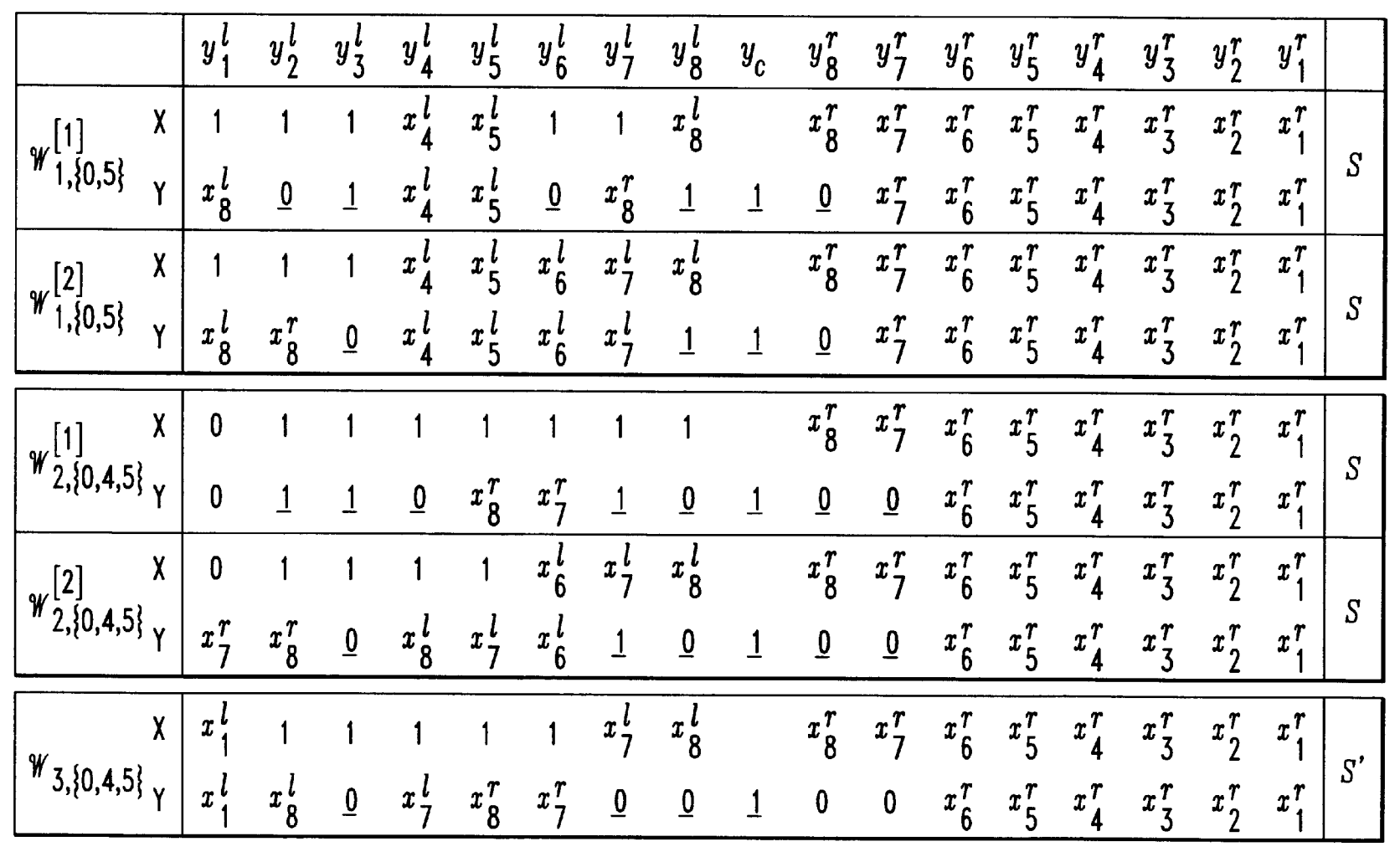

The mapping for the data words $X \in W_{i,\{0,\ldots,\}}$, where $1 \leq i \leq 5$, is specified in the table of FIG. 12. The character S in the rightmost column of this table marks the sets $W_{i,j}{}^{[p]}$ that have the property that by reversing the order of X and Y the mapping of the set $W_{j,i}{}^{[p]}$ is specified. Sets having the same property with the exception that the central indicator 00100 is replaced by 01110 and vice versa, are marked by S' in the table.

Observe that in several cases the indicator in the middle of the codeword causes the righthand side of the codeword to satisfy the constraints. There are in fact 12 out of the 25 subsets $W_{i,j}$, with $1 \leq i,j \leq 5$, which no longer have to be considered. The mapping for the other sets will be specified separately in subsequent tables.

Consider first the situation for the sets $W_{i,j}$ where $1 \leq i \leq 3$ and $1 \leq j \leq 3$. The mapping, specified in the table of FIG. 13, is of the form $Y=\psi(X)=\psi_l(X^l)$ 1 $\psi_r(X^r)$ $\psi$ $M_7$, i.e., the left part of the codeword Y is specified by a mapping $\psi_l(X^l)$ which depends on $X^l$ only. The same holds for the right part of the codeword, which is given by $\psi_r(X^r)$, depending on $X^r$ only.

As an example, consider the data word $X=X^lX^r=$ 11101001 11111110. It can be shown that $X^l \in V_1{}^{[2]}$ and $X^r \in V_2{}^{[1]}$. The table of FIG. 13 indicates that in this situation $X^l$ is mapped onto $Y^l=10001010$ and $X^r$ is mapped onto $Y^r=10111010$. The resulting codeword $Y=Y^lY^r=10001010$ 1 01011101.

It can be verified that $|V_1{}^{[1]}|=4$, $|V_1{}^{[2]}|=28$, $|V_2{}^{[1]}|=2$, $|V_2{}^{[2]}|=6$ and $|V_3|=8$. Since the above-described mapping applies to both the lefthand side and the righthand side of an element $X \in W_{i,j}$, where $1 \leq i \leq 3$ and $1 \leq j \leq 3$, there are in total 48×48=2304 data words that fall into this category and that are transformed in accordance with these rules. Note that the set $M_7$ with central indicator 10101 is used exclusively to identify this category.

The mapping of the words $X \in W_{4,1}$ is specified in the table of FIG. 14.

The sets $W_{4,4}$ and $W_{5,5}$ are the only sets for which the mapping has not yet been specified. As there are only very few candidate words remaining, the sets have to be further partitioned in the manner previously described in order to be able to map all their elements. The resulting mapping is specified in the table of FIG. 15.

At this stage the specification of the mapping from the data words to the codewords is completed. The table in FIG. 16 gives an overview of the number of sequences of the sets $M_0$ through $M_7$ that are part of the code set.

FIG. 17 shows a table listing the 18 surplus candidate words in this illustrative embodiment. One or more of these words may be used to replace codewords or as special recognition sequences for frame synchronization.

FIG. 18 shows a table listing the partitions of the sets $M_1$, $M_3$ and $M_5$. The dots are placeholders for the data values. It can be seen that the patterns of underlined zeros and ones in this table uniquely identify the corresponding sets of data words $W_{i,j}^{[p]}$. By reversing the mapping that has been specified for this particular set, the data words can be reconstructed. The partitions of the sets $M_2$, $M_4$ and $M_6$ are, because of the symmetry, very similar.

It is important to restrict the number of consecutive zeros in the sequence of concatenated codewords in order to have a sufficient number of transitions in the NRZI modulated signal over a designated period of time, for purposes of clock recovery. The constructed 16/17, (0,3,2,2) MTR code described above fulfils the (0,15,9,9) RLL constraints. Let $k_l^{(0)}$ and $k_r^{(0)}$ denote the number of leading and trailing zeros of a particular codeword, and let $k^{(0)}$ denote the maximum run of zeros in the codeword. To estimate the likelihood that sequences with long runs of consecutive zeros occur, one can determine the number of codewords for which $k^{(0)}=i$. The table in FIG. 19 gives the distribution of $k^{(0)}$, where $0 \leq i \leq 17$, for the $2^{16}$ codewords. The number of codewords for which $k_l^{(0)}=i$, $0 \leq i \leq 17$, and the number of codewords for which $k_r^{(0)}=i$, $0 \leq i \leq 17$, is also specified in the FIG. 19 table.

It can be seen that, in compliance with the illustrative code design constraints, max $(k_l^{(0)})=9$, max $(k_r^{(0)})=9$, and max $(k^{(0)})=15$. Since there is a surplus of 18 words in this design, it is possible to obtain a 16/17, (0,3,2,2) MTR code that fulfils (0,12,9,9) RLL constraints by removing the 15 words that exceed these constraints. However, it is not possible to further restrict the number of leading and trailing zeros, as this would require a surplus of at least 93 words. Since $k_l^{(0)}+k_r^{(0)}$ is at most 18, a reduction of the $k^{(0)}$ constraint from 15 to 12 is not expected to give a significant improvement in performance.

The above-described illustrative MTR-RLL code can be expanded into other useful codes, as will be described below in conjunction with FIGS. 20 through 25.

The rate 16/17, (0,3,2,2) MTR code, being equivalent to a (0,3,2,2) RLL code, could be used as a basic code for the construction of higher rate codes using interleaving. For example, interleaving the (0,3,2,2) RLL code in the manner illustrated in FIG. 20 results in a rate 48/49, (0,11,6,6) code. In FIGS. 20 through 25, a box containing an "x" is a placeholder for a symbol of the basic (0,3,2,2) RLL code, and an open box is a placeholder for interleaved uncoded information bits.

Figure 22:

In order to suppress error propagation, one can use a strategy where the data symbols remain unchanged unless the (0,12,6,6) constraints are violated. Consider the codeword profile shown in FIG. 21, where the 16 positions denoted by a box containing a "·" represent the input data of the (0,3,2,2) RLL code. The middle position is set to 1 as shown. If this string of length 49 already fulfils the (0,12,6,6) constraints, there is no need to transform the input. However, if the (0,12,6,6) constraints are violated, the (0,3,2,2) RLL code can be used to fulfil the constraints. Since the input data will be transformed in this situation, the middle position will be equal to zero, as illustrated in FIG. 22. At the decoder side, the middle position of the code indicates whether or not the input data was encoded.

The probability that the data input of the 48/49 (0,12,6,6) code will need to be transformed to satisfy the constraints is very low. There are $$F_{12,6,12}^{(24)} = 16634912$$

words of length 24 that satisfy the (0,12,6,12) constraints. Since the default value of the middle position is 1, thereby separating the code in two independent blocks of 24 bits, the number of words that do not have to be converted is equal to $(16634912)^2$. This means that the probability that the input of the rate 16/17, (0,3,2,2) code has to be transformed to satisfy the constraints of the 48/49 (0,12,6,6) code is equal to $$1 - \left[\frac{16634912}{2^{24}}\right]^2 = 0.01689,$$

i.e., the input will have to be transformed in about 1.69 percent of the cases. Since the idea behind the 16/17 (0,3,2,2) code was to change only a limited number of bits to satisfy the constraints, it is expected that the 48/49 code will be very close to the uncoded situation, in which case there will be a very limited probability of error propagation if detection errors occur.

Figure 23:

An alternative interleaving technique for obtaining a 48/49, (0,11,6,6) code using the basic 16/17, (0,3,2,2) code is illustrated in FIG. 23. This arrangement has the advantage that every codeword starts and ends with unconstrained positions, which means that burst errors at the boundaries do not cause any error propagation. In addition, the spacing between coded bits is either 4 or 8 unconstrained bits, i.e., it is byte-level oriented. As the single bytes are separated, short bursts are more likely to destroy one uncoded byte only.

Figure 24:
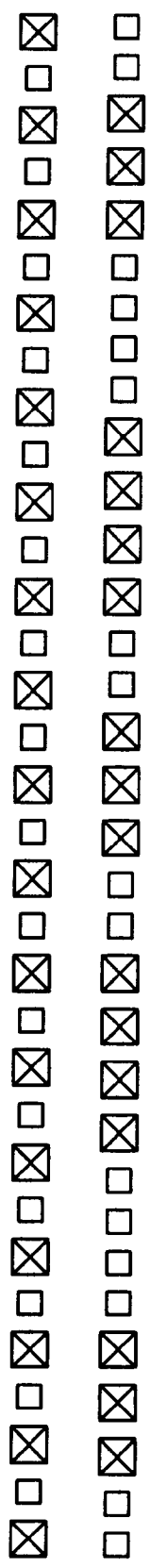

In a similar fashion as for the above-described rate 48/49 code, it is possible to obtain a 32/33, (0,7,4,4) code from the basic 16/17, (0,3,2,2) code by interleaving the codewords with uncoded bits according to one of the profiles shown in FIG. 24. Since there are $$F_{8,4,8}^{(16)} = 63044$$

words of length 16 that fulfil the (0,8,4,8) constraints, the probability that a data word needs to be converted is 0.0746. If one would like to have run-length constraints that are less tight than (0,8,4,4), one could for example use a rate 8/9 code that was designed to minimize the run-length constraints when the code is interleaved.

Figure 25:

By interleaving the rate 8/9, (0,3,2,2) code specified in K. A. Schouhamer-Immink and A. Wijngaarden, "Simple high-rate constrained codes," Electronics Letters, Vol. 32, No. 20, p. 1877, 1996, which is incorporated by reference herein, a rate 32/33, (0,11,6,6) code can be constructed. The resulting codeword profile is shown in FIG. 25. In this case there are exactly 8 bits between the blocks of codeword symbols. If this code is used to obtain a rate 32/33, (0,12,6,6) code, there will be $$F^{(16)}_{12,6,12} = 65012$$

sequences of length 16 that satisfy the (0,12,6,12) constraints and therefore the probability that a data word needs to be converted is $$1 - \left[\frac{65012}{2^{16}}\right]^2 = 0.0159.$$

It should be emphasized that the exemplary codes and coding techniques described herein are intended to illustrate the operation of the invention, and therefore should not be construed as limiting the invention to any particular embodiment or group of embodiments. These and numerous other alternative embodiments within the scope of the following claims will therefore be apparent to those skilled in the art.

What is claimed is:

1. A method of encoding information, the method comprising the steps of:
   converting data words into corresponding codewords of a code, wherein the codewords are subject to one or more constraints on the number of consecutive like symbols, and a set of the data words is partitioned into a plurality of disjoint subsets each including one or more of the data words and corresponding to a distinct mapping, and further wherein the converting step includes applying to a given data word the mapping associated with the subset containing that data word; and
   outputting the codewords.

2. The method of claim 1 wherein the converting step includes mapping (n−1)-bit data words onto n-bit codewords of a $(0,k,k_l,k_r)$ code.

3. The method of claim 1 wherein the converting step further includes the steps of:
   determining whether the data word if modified with insertion of an additional fixed-value bit would result in a valid codeword;
   if the data word as modified would result in a valid codeword, generating the codeword as a copy of the data word with the additional bit inserted to indicate that the other bits of the codeword are a copy of the data word; and
   if the data word is not a valid codeword, applying a mapping to transform the data word into an (n−1)-bit coded sequence that satisfies the imposed $(0,k,k_l,k_r)$ constraints, and inserting an additional bit indicating that the mapping was applied to generate the codeword.

4. The method of claim 1 wherein the set of data words is partitioned into a plurality of disjoint subsets, a corresponding set of the codewords is partitioned into a plurality of disjoint subsets, and the mapping for a given one of the disjoint subsets of the data words specifies the mapping of the data words belonging to this subset to the codewords belonging to a corresponding disjoint subset of the codewords.

5. The method of claim 1 wherein if Y=ψ(X) represents the mapping of a given data word X onto a corresponding codeword Y, then X' and Y', representing the words X and Y in reversed order, satisfy the relation Y'=ψ(X').

6. The method of claim 1 further including the step of processing the codewords for delivery to a channel characterized by an $^{N-1}$PR4 channel model and having a channel transfer function given by $h(D)=(1-D)(1+D)^N$.

7. The method of claim 1 wherein the constraint comprises one of an F={1111, 11100} NRZI strong constraint, an F={1111, 00111} NRZI strong constraint, an F={1111, 11100$_{odd}$, 00111$_{odd}$} NRZI strong constraint, an F={1111} NRZI weak constraint, an F={11111} NRZI weak constraint, and an F={1010} NRZ weak constraint.

8. The method of claim 1 wherein the code is a $(0,k,k_l,k_r)$ run-length limited (RLL) block code of length n, where k denotes the maximum number of zeros between consecutive ones in a given codeword, and $k_l$ and $k_r$ denote the maximum number of leading and trailing zeros, respectively, of a given codeword.

9. The method of claim 1 wherein the code is a $(0,k,k_l,k_r)$ maximum transition run (MTR) code, where k denotes the maximum number of ones between consecutive zeros in a given codeword, and $k_l$ and $k_r$ denote the maximum number of leading and trailing ones, respectively, of a given codeword.

10. The method of claim 1 wherein the code is a rate 16/17, (0,3,2,2) MTR code which satisfies a (0,15,9,9) RLL constraint, and further wherein the code is equivalent to a rate 16/17, (0,3,2,2) RLL code which satisfies a (0,15,9,9) MTR constraint and in which the ones and zeros are interchanged.

11. The method of claim 1 wherein the code is generated by interleaving symbols of a first code with uncoded bits of a data word.

12. The method of claim 11 further including the step of utilizing a given one of the data words in uncoded form as a corresponding symbol of the first code if a constraint of the first code is not violated by the data word, in order to reduce error propagation.

13. The method of claim 11 wherein the code is a rate 48/49, (0,11,6,6) code generated by interleaving symbols of a rate 16/17, (0,3,2,2) code with uncoded bits of a data word.

14. The method of claim 11 wherein the code is a rate 32/33, (0,7,4,4) code generated by interleaving symbols of a rate 16/17, (0,3,2,2) code with uncoded bits of a data word.

15. The method of claim 11 wherein the code is a rate 32/33, (0,11,6,6) code generated by interleaving symbols of a rate 8/9, (0,3,2,2) code with uncoded bits of a data word.

16. The method of claim 11 wherein the code is a rate 32/33, (0,12,6,6) code generated by interleaving symbols of a rate 8/9, (0,3,2,2) code with uncoded bits of a data word.

17. An apparatus for encoding information, the apparatus comprising:
   an encoder for converting data words into corresponding codewords of a code, wherein the codewords are subject to one or more constraints on the number of consecutive like symbols, and a set of the data words is partitioned into a plurality of disjoint subsets each including one or more of the data words and corresponding to a distinct mapping, and further wherein the encoder converts a given data word by applying to that data word the mapping associated with the subset containing that data word.

18. A method of decoding information, the method comprising the steps of:
   converting codewords of a code into corresponding data words, wherein the codewords are subject to one or more constraints on the number of consecutive like symbols, and a set of the codewords is partitioned into a plurality of disjoint subsets each including one or more of the codewords and corresponding to a distinct mapping, and further wherein the converting step includes applying to a given codeword the mapping associated with the subset containing that codeword; and outputting the data words.

19. An apparatus for decoding information, the apparatus comprising:

a decoder for converting codewords of a code into corresponding data words, wherein the codewords are subject to one or more constraints on the number of consecutive like symbols, and a set of the codewords is partitioned into a plurality of disjoint subsets each including one or more of the codewords and corresponding to a distinct mapping, and further wherein the converting step includes applying to a given codeword the mapping associated with the subset containing that codeword.

20. A method of encoding information, the method comprising the steps of:

converting data words into corresponding codewords of a code, wherein the codewords are subject to one or more constraints on the number of consecutive like symbols, and the data words are partitioned into a plurality of disjoint subsets each corresponding to a distinct mapping, wherein the converting step includes: determining whether the data word if modified with insertion of an additional fixed-value bit would result in a valid codeword; if the data word as modified would result in a valid codeword, generating the codeword as a copy of the data word with the additional bit inserted to indicate that the other bits of the codeword are a copy of the data word; and if the data word is not a valid codeword, applying a mapping to transform the data word into an (n−1)-bit coded sequence that satisfies the imposed $(0,k,k_l,k_r)$ constraints, and inserting an additional bit indicating that the mapping was applied to generate the codeword; and outputting the codewords.

21. A method of encoding information, the method comprising the steps of:

converting data words into corresponding codewords of a code, wherein the codewords are subject to one or more constraints on the number of consecutive like symbols, and the data words are partitioned into a plurality of disjoint subsets each corresponding to a distinct mapping, wherein the converting step includes applying to a given data word the mapping associated with the subset containing that data word, and further wherein if $Y=\psi(X)$ represents the mapping of a given data word X onto a corresponding codeword Y, then X' and Y' representing the words X and Y in reversed order, satisfy the relation $Y'=\psi(X')$; and outputting the codewords.

22. A method of encoding information, the method comprising the steps of:

converting data words into corresponding codewords of a code, wherein the codewords are subject to one or more constraints on the number of consecutive like symbols, the one or more constraints comprising one of an F={1111, 11100} NRZI strong constraint, an F={1111, 00111} NRZI strong constraint, an F={1111, 11100$_{odd}$, 00111$_{odd}$} NRZI strong constraint, an F={1111} NRZI weak constraint, an F={11111} NRZI weak constraint, and an F={1010} NRZ weak constraint, and the data words are partitioned into a plurality of disjoint subsets each corresponding to a distinct mapping, and further wherein the converting step includes applying to a given data word the mapping associated with the subset containing that data word; and outputting the codewords.

23. A method of encoding information, the method comprising the steps of:

converting data words into corresponding codewords of a code, wherein the codewords are subject to one or more constraints on the number of consecutive like symbols, and the data words are partitioned into a plurality of disjoint subsets each corresponding to a distinct mapping, wherein the code is a rate 16/17, (0,3,2,2) MTR code which satisfies a (0,15,9,9) RLL constraint, and further wherein the code is equivalent to a rate 16/17, (0,3,2,2) RLL code which satisfies a (0,15,9,9) MTR constraint and in which the ones and zeros are interchanged, and further wherein the converting step includes applying to a given data word the mapping associated with the subset containing that data word; and outputting the codewords.

24. A method of encoding information, the method comprising the steps of:

converting data words into corresponding codewords of a code, wherein the code is generated by interleaving symbols of a first code with uncoded bits of a data word, wherein the codewords are subject to one or more constraints on the number of consecutive like symbols, and wherein the data words are partitioned into a plurality of disjoint subsets each corresponding to a distinct mapping, and further wherein the converting step includes applying to a given data word the mapping associated with the subset containing that data word; and outputting the codewords.

* * * * *